United States Patent
Park

(10) Patent No.: US 11,411,050 B2
(45) Date of Patent: Aug. 9, 2022

(54) MEMORY DEVICE HAVING CONDUCTIVE LINES CROSSING EACH OTHER

(71) Applicant: SK hynix Inc., Icheon (KR)

(72) Inventor: Nam Kyun Park, Seoul (KR)

(73) Assignee: SK hynix Inc., Icheon (KR)

( * ) Notice: Subject to any disclaimer, the term of this patent is extended or adjusted under 35 U.S.C. 154(b) by 78 days.

(21) Appl. No.: 16/813,549

(22) Filed: Mar. 9, 2020

(65) Prior Publication Data
US 2021/0036056 A1     Feb. 4, 2021

(30) Foreign Application Priority Data
Jul. 31, 2019   (KR) .................. 10-2019-0093465

(51) Int. Cl.
*H01L 47/00*    (2006.01)
*H01L 27/24*    (2006.01)
*H01L 45/00*    (2006.01)

(52) U.S. Cl.
CPC ........ *H01L 27/249* (2013.01); *H01L 45/1233* (2013.01)

(58) Field of Classification Search
CPC .................................................... H01L 27/249
See application file for complete search history.

(56) References Cited

U.S. PATENT DOCUMENTS

| | | | |
|---|---|---|---|
| 8,922,020 B2 | 12/2014 | Chen et al. | |
| 9,236,124 B2* | 1/2016 | Takagi | .............. H01L 45/146 |
| 9,362,500 B2* | 6/2016 | Yamato | .............. H01L 45/1616 |
| 9,379,163 B1* | 6/2016 | Arayashiki | ......... H01L 27/2481 |
| 9,711,721 B2* | 7/2017 | Takagi | .............. H01L 27/2454 |
| 2012/0319072 A1* | 12/2012 | Wei | ........................ H01L 27/249 |
| | | | 257/4 |
| 2017/0005262 A1* | 1/2017 | Hwang | .................. H01L 45/08 |
| 2017/0154675 A1* | 6/2017 | Kang | .................. G11C 13/003 |
| 2017/0242660 A1* | 8/2017 | Katoh | ................ G11C 13/0007 |
| 2018/0144793 A1* | 5/2018 | Jo | ........................ G11C 13/003 |

FOREIGN PATENT DOCUMENTS

KR    20180034696 A    4/2018

* cited by examiner

*Primary Examiner* — Caleb E Henry

(57) ABSTRACT

A memory device is provided. A memory device includes a memory cell array having variable resistance memory cells that are coupled to and disposed between first conductive lines extending in a first direction and second conductive lines crossing the first conductive lines, and a selection circuit configured to select the first conductive lines. The second conductive lines include straight conductive lines extending in a second direction that crosses the first direction, and first bending conductive lines spaced apart from the selection circuit by the straight conductive lines, the first bending conductive lines extending parallel with each other, and having an L shape.

23 Claims, 23 Drawing Sheets

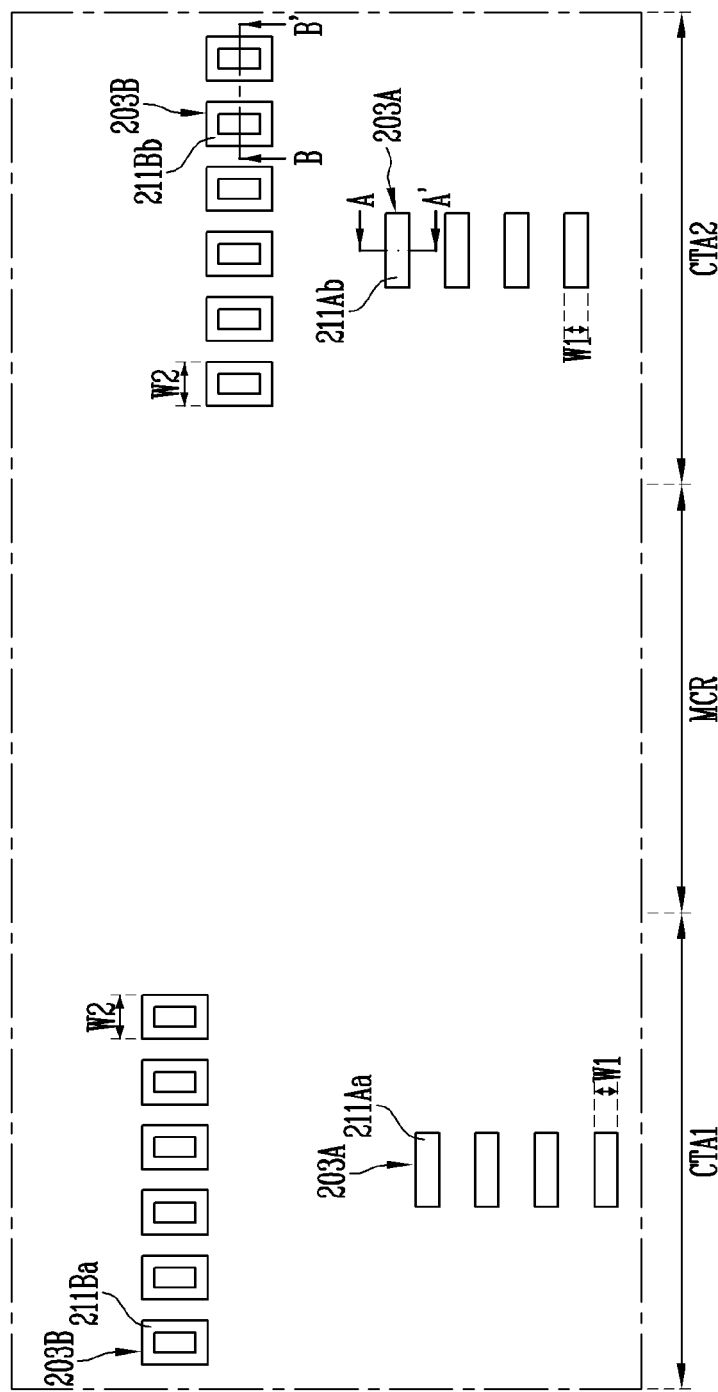

MEMORY DEVICE HAVING CONDUCTIVE LINES CROSSING EACH OTHER

CROSS-REFERENCE TO RELATED APPLICATION

The present application claims priority under 35 U.S.C. § 119(a) to Korean Patent Application Number 10-2019-0093465, filed on Jul. 31, 2019, which is incorporated herein by reference in its entirety.

BACKGROUND

Field of Invention

Various embodiments of the present disclosure relate to a memory device, and more particularly, to a memory device using a variable resistance material.

Description of Related Art

Electronic devices, such as a computer, a digital camera, and a smartphone, may process data using a memory system. A memory system may include a memory device storing data and a controller controlling the memory device.

Various memory devices trend toward high performance, miniaturization, and low power consumption. Variable resistance memory devices have been proposed as examples of a next-generation memory device. A variable resistance memory device may have different resistance states depending on a voltage or current applied to a memory cell and maintain a resistance state stored in a memory cell independently of an externally supplied power. Examples of variable resistance memory devices include a Phase change Random Access Memory (PRAM), a Magnetic RAM (MRAM), a Resistive RAM (RRAM), Ferroelectric RAM (FRAM), an e-fuse, and so on.

SUMMARY

According to an embodiment, a memory device may include a memory cell array having variable resistance memory cells that are coupled to and disposed between first conductive lines extending in a first direction and second conductive lines crossing the first conductive lines and a selection circuit configured to select the first conductive lines. The second conductive lines may include straight conductive lines extending in a second direction that crosses the first direction and first bending conductive lines spaced apart from the selection circuit by the straight conductive lines, the first bending conductive lines extending parallel with each other, and having an L shape.

The memory device may further include first contact plugs coupled to the straight conductive lines and second contact plugs coupled to the first bending conductive lines. Each of the first contact plugs and the second contact plugs may extend in a third direction being perpendicular to the first direction and the second direction, and the second contact plugs may have resistance smaller than resistance of the first contact plugs.

A width of each of the second contact plugs in the second direction may be greater than a width of each of the first contact plugs in the first direction.

Each of the second contact plugs may include a first conductive material and a second conductive material that have different resistivity from each other.

One of the first conductive material and the second conductive material may be the same as a material included in each of the first contact plugs.

According to an embodiment, a memory device may include a first conductive line including first, second, and third portions sequentially arranged in a first direction, first variable resistance memory cells coupled to the first portion of the first conductive line and arranged in the first direction, a second variable resistance memory cell coupled to the second portion of the first conductive line, a third variable resistance memory cell coupled to the third portion of the first conductive line, and second conductive lines coupled to the first, second, and third variable resistance memory cells and crossing the first conductive line. The second conductive lines may include straight conductive lines, a first bending conductive line, and a second bending conductive line. The straight conductive lines may be coupled to the first variable resistance memory cells, respectively. The first bending conductive line may include a first cell line portion and a first contact line portion, the first cell line portion being coupled to the second variable resistance memory cell and crossing the first conductive line, the first contact line portion extending from the first cell line portion in the first direction. The second bending conductive line may include a second cell line portion and a second contact line portion, the second cell line portion being coupled to the third variable resistance memory cell and crossing the first conductive line, the second contact line portion extending from the second cell line portion toward the straight conductive lines.

The memory device may further include a selection circuit connected to an end of the first conductive line. The first portion of the first conductive line may be disposed closest to the selection circuit among the first, second, and third portions of the first conductive line.

The memory device may further include first contact plugs coupled to the straight conductive lines, respectively, and second contact plugs coupled to the first contact line portion and the second contact line portion, respectively, and having resistance smaller than resistance of the first contact plugs.

BRIEF DESCRIPTION OF THE DRAWINGS

FIGS. 9A, 9B, 9C, 10A, 10B, 11A, 11B, 11C, 12A, 12B, 12C, 13, 14A, 14B, 15A, 15B, 16A, 16B, and 16C illustrate a method of manufacturing a memory device according to an embodiment of the present disclosure;

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Various embodiments of the present disclosure provide a memory device capable of improving the operational reliability.

Figure 1:
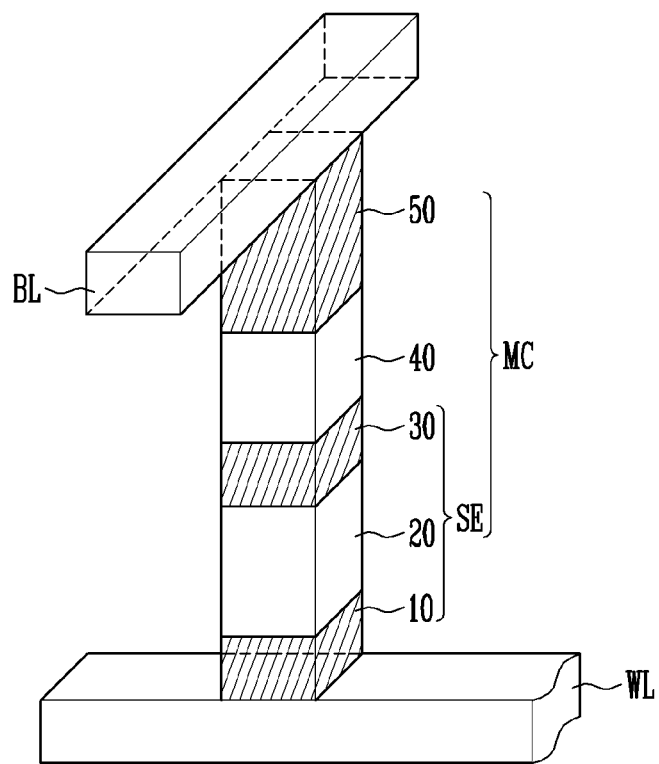
FIG. 1 illustrates a variable resistance memory cell according to an embodiment of the present disclosure.

FIG. 1 illustrates a variable resistance memory cell MC according to an embodiment of the present disclosure.

Referring to FIG. 1, the variable resistance memory cell MC may be disposed at an intersection of a word line WL and a bit line BL and between the word line WL and the bit line BL. The word line WL may cross the bit line BL. The variable resistance memory cell MC may be coupled to the word line WL and the bit line BL.

Each of the word line WL and the bit line BL may include a metal, a conductive metal nitride, a conductive metal oxide, an alloy thereof, or a combination thereof. According to an embodiment, each of the word line WL and the bit line BL may include W, Ti, Ta, Al, Cu, C, CN, TiN, TiAlN, TiSiN, TiCN, TiCSiN, WN, CoSiN, WSiN, TaN, TaCN, TaSiN, Au, Ag, Ir, Pt, Pd, Ru, Zr, Rh, Ni, Co, Cr, Sn, Zn, ITO, an alloy thereof, or a combination thereof. According to another embodiment, each of the word line WL and the bit line BL may include a metal layer and a conductive barrier layer. The conductive barrier layer may include Ti, TiN, Ta, TaN, or a combination thereof.

A voltage may be applied through the word line WL and the bit line BL to the variable resistance memory cell MC, and thus a current may flow in the variable resistance memory cell MC to drive the variable resistance memory cell MC. For example, data may be written in the variable resistance memory cell MC by an electric field formed between the word line WL and the bit line BL coupled to the variable resistance memory cell MC. In addition, data determined according to a resistance value of the variable resistance memory cell MC may be read by measuring a current flowing through the bit line BL.

The variable resistance memory cell MC may include a variable resistance layer 40 disposed between the word line WL and the bit line BL, a first electrode 50 coupled to and disposed between the variable resistance layer 40 and the bit line BL, and a selection device SE coupled to and disposed between the variable resistance layer 40 and the word line WL.

An order of stacking the bit line BL, the first electrode 50, the variable resistance layer 40, the selection device SE, and the word line WL is not limited to the embodiment shown in FIG. 1. According to other embodiments, the order may be variously changed. For example, with respect to the orientation of FIG. 1, an order of sequentially stacking the word line WL, the selection device SE, the variable resistance layer 40, the first electrode 50, and the bit line BL may be inverted. That is, the order of sequentially stacking the word line WL, the selection device SE, the variable resistance layer 40, and the bit line BL may be changed to an order of sequentially stacking the bit line BL, the first electrode 50, the variable resistance layer 40, the selection device SE, and the word line WL.

The selection device SE may be a current adjusting device capable of adjusting a current flow in the variable resistance memory cell MC. The selection device SE may include a selection device layer 20, an intermediate electrode 30 disposed between the selection device layer 20 and the variable resistance layer 40, and a second electrode 10 disposed between the word line WL and the selection device layer 20.

According to an embodiment, the selection device layer 20 may include a diode having a rectifying property. For example, the selection device layer 20 may include a silicon diode in which a first polysilicon layer doped with a p-type impurity and a second polysilicon layer doped with an n-type impurity are attached to each other, an oxide diode in which p-NiOx and n-TiOx are attached to each other, or an oxide diode in which p-CuOx and n-TiOx are attached to each other.

According to an embodiment, the selection device layer 20 may include an oxide. When a voltage lower than or equal to a predetermined voltage is applied to the selection device layer 20, a current flowing through the oxide is substantially blocked due to high resistance. On the other hand, when a voltage exceeding the predetermined voltage is applied to the selection device layer 20, a current flows through the selection device layer 20 due to low resistance. For example, the selection device layer 20 may include ZnOx, MgOx, AlOx, or a combination thereof.

According to an embodiment, the selection device layer 20 may include a chalcogenide-based ovonic threshold switch (OTS) material. For example, the selection device layer 20 may include arsenic (As) and a compound comprising two or more of silicon (Si), germanium (Ge), antimony (Sb), tellurium (Te), selenium (Se), indium (In), and tin (Sn).

Each of the first electrode 50, the second electrode 10, and the intermediate electrode 30 may include a metal, a conductive metal nitride, a conductive metal oxide, a conductive material including carbon, or a combination thereof. For example, each of the first electrode 50, the second electrode 10, and the intermediate electrode 30 may include C, W, WN, WC, SiN, SiCN, TiN, TION, Al, AlN, Ta, TaN, an alloy thereof, or a combination thereof.

A phase of the variable resistance layer 40 may be reversibly changed by Joule heat generated by a voltage applied to the bit line BL and the word line WL. The variable resistance layer 40 may include a phase change material of which resistance may be changed by the phase change. For example, the variable resistance layer 40 may include a chalcogenide-based material. The chalcogenide-based material may be a germanium-antimony-tellurium (GST)-based material in which germanium (Ge), antimony (Sb), and tellurium (Te) are compounded at a predetermined ratio.

The variable resistance memory cell MC may be programmed to a set state or a reset state depending on a bias condition of the word line WL and the bit line BL. When a set voltage or a set pulse is applied to the variable resistance memory cell MC in the reset state in order to program the variable resistance memory cell MC to the set state, the variable resistance memory cell MC may be converted from the reset state with high resistance to the set state with low resistance. When a reset voltage or a reset pulse is applied to the variable resistance memory cell MC in the set state in order to program the variable resistance memory cell MC to the reset state, the variable resistance memory cell MC may be converted from the set state to the reset state.

A current flowing in the variable resistance memory cell MC may vary depending on where the variable resistance memory cell MC is located in a memory cell array. For example, among variable resistance memory cells coupled to the word line WL, a current flowing in a first variable resistance memory cell may be greater than a current flowing in a second variable resistance memory cell located farther from a row selection circuit than the first variable resistance memory cell.

In another example, among variable resistance memory cells coupled to the bit line BL, a current flowing in a third variable resistance memory cell may be greater than a current flowing in a fourth variable resistance memory cell located farther from a column selection circuit than the third variable resistance memory cell. Accordingly, when the variable resistance memory cell MC is disposed closer to a row selection circuit or a column selection circuit and thus an excessive current flows in the variable resistance memory cell MC during a set program operation, the characteristics of the variable resistance memory cell MC and the durability of a memory device including the variable resistance memory cell MC may be deteriorated.

According to embodiments of the present disclosure, resistance of contact plugs coupled to the word line WL or the bit line BL, or both may be differently adjusted depending on a location of the variable resistance memory cell MC in the memory cell array. Accordingly, a set current of the variable resistance memory cell MC that excessively increases depending on the location of the variable resistance memory cell MC may be improved.

According to embodiments of the present disclosure, widths of the contact plugs may be differently adjusted considering resistance of the contact plugs and a layout of the word line WL and the bit line BL may be changed in accordance with the widths of the contact plugs. Hereinafter, widths of contact plugs and a layout of conductive lines coupled to the contact plugs according to embodiments of the present disclosure will be described.

Figure 2:
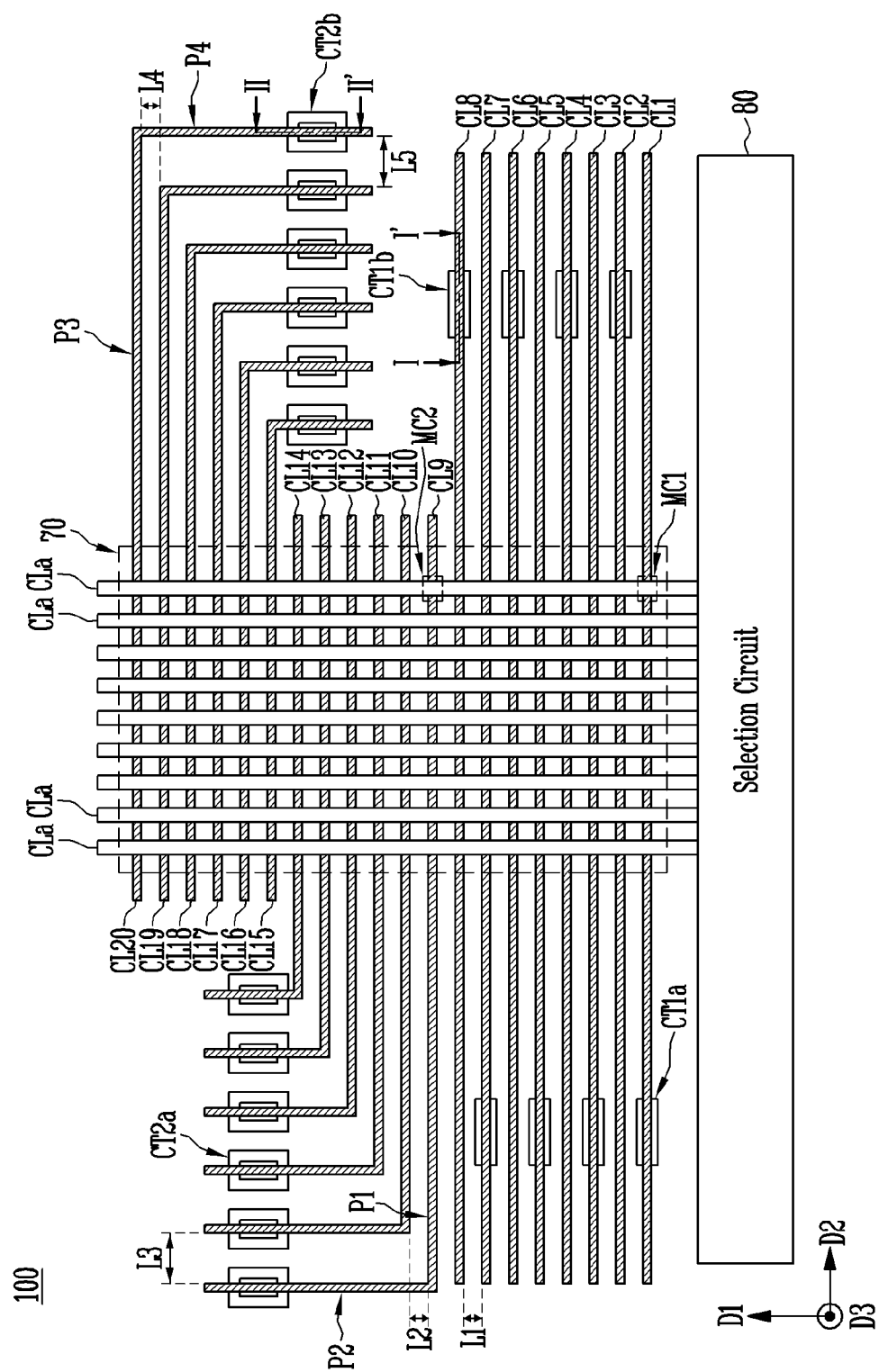
FIG. 2 illustrates a layout of first conductive lines and second conductive lines according to an embodiment of the present disclosure.

FIG. 2 illustrates a layout of first conductive lines CLa and second conductive lines CL1 to CL20 according to an embodiment of the present disclosure.

Each of the first conductive lines CLa and the second conductive lines CL1 to CL20 may serve as the bit line BL or the word line WL shown in FIG. 1. For example, when each of the first conductive lines CLa serves as the bit line BL shown in FIG. 1, each of the second conductive lines CL1 to CL20 may serve as the word line WL shown in FIG. 1. In another example, when each of the first conductive lines CLa serves as the word line WL shown in FIG. 1, each of the second conductive lines CL1 to CL20 may serve as the bit line BL shown in FIG. 1. The number of first conductive lines CLa and the number of second conductive lines CL1 to CL20 are not limited to the numbers illustrated in FIG. 2. According to other embodiments, the numbers may be variously changed.

Referring to FIG. 2, a memory device 100 may include the first conductive lines CLa, the second conductive lines CL1 to CL20 crossing the first conductive lines CLa, a memory cell array 70 formed at intersections of the first conductive lines CLa and the second conductive lines CL1 to CL20, and a selection circuit 80 for selecting the first conductive lines CLa.

The first conductive lines CLa may be coupled to the selection circuit 80, and may extend in a first direction D1. The first conductive lines CLa may be spaced apart from each other in a second direction D2 crossing the first direction D1. In FIG. 2, a third direction D3 is perpendicular to the first direction D1 and the second direction D2.

The second conductive lines CL1 to CL20 may include straight conductive lines CL1 to CL8 and bending conductive lines CL9 to CL20. The bending conductive lines CL9 to CL20 may include first bending conductive lines CL9 to CL14 and second bending conductive lines CL15 to CL20.

The straight conductive lines CL1 to CL8 may be successively disposed to be adjacent to the selection circuit 80. The straight conductive lines CL1 to CL8 may extend in the second direction D2, and may be spaced apart from each other by a first distance L1 in the first direction D1.

The first bending conductive lines CL9 to CL14 may be spaced apart from the selection circuit 80 by the straight conductive lines CL1 to CL8. In other words, the straight conductive lines CL1 to CL8 are disposed between the selection circuit 80 and the first bending conductive lines CL9 to CL14. Therefore, the first bending conductive lines CL9 to CL14 may be disposed to be farther from the selection circuit 80 than the straight conductive lines CL1 to CL8. The first bending conductive lines CL9 to CL14 may extend in parallel with each other in the first and second directions D1 and D2.

The first bending conductive lines CL9 to CL14 may include first cell line portions P1 and first contact line portions P2. The first cell line portions P1 may extend in the second direction D2, and may be spaced apart from each other by a second distance L2 in the first direction D1. The first contact line portions P2 may extend from the first cell line portions P1, respectively, in the first direction D1. The first contact line portions P2 may be spaced apart from each other by a third distance L3 in the second direction D2. The second distance L2 may be substantially the same as the first distance L1. The third distance L3 may be greater than each of the first distance L1 and the second distance L2. Each of the first bending conductive lines CL9 to CL14 may have an 'L' shape by connecting a corresponding first cell line portion P1 to a corresponding first contact line portion P2.

The second bending conductive lines CL15 to CL20 may be spaced apart from the selection circuit 80 by the straight conductive lines CL1 to CL8 and the first bending conductive lines CL9 to CL14. The second bending conductive lines CL15 to CL20 may be disposed to be farther from the selection circuit 80 than the straight conductive lines CL1 to CL8. The second bending conductive lines CL15 to CL20 may cross end portions of the first conductive lines CLa. The second bending conductive lines CL15 to CL20 may extend in parallel to each other in the first and second directions D1 and D2.

The second bending conductive lines CL15 to CL20 may include second cell line portions P3 and second contact line portions P4. The second cell line portions P3 may extend in the second direction D2, and may be spaced apart from each other by a fourth distance L4 in the first direction D1. The second contact line portions P4 may extend from the second cell line portions P3 toward the straight conductive lines CL1 to CL8. The second contact line portions P4 may be spaced apart from each other by a fifth distance L5 in the second direction D2. The fourth distance L4 may be substantially the same as the second distance L2 or the first distance L1. The fifth distance L5 may be greater than each of the first distance L1, the second distance L2, and the fourth distance L4.

The second contact line portions P4 may extend from the second cell line portions P3 of the second bending conductive lines CL15 to CL20 in a direction opposite to a direction in which the first contact line portions P2 extend from the first cell line portions P1 of the first bending conductive lines CL9 to CL14. The second contact line portions P4 of the second bending conductive lines CL15 to CL20 may be spaced apart from the first contact line portions P2 of the first bending conductive lines CL9 to CL14 by the memory cell array 70 and the first conductive lines CLa.

Each of the straight conductive lines CL1 to CL8 may be coupled to a contact plug CT1a or CT1b, each of the first contact line portions P2 of the first bending conductive lines CL9 to CL14 may be coupled to a contact plug CT2a, and each of the second contact line portions P4 of the second bending conductive lines CL15 to CL20 may be coupled to a contact plug CT2b. The contact plugs CT1a, CT1b, CT2a, and CT2b may be divided into a first contact plug group CT1a and CT2a and a second contact plug group CT1b and CT2b, according to where they are disposed. The first contact plug group CT1a and CT2a and the second contact plug group CT1b and CT2b are spaced apart from each other by the memory cell array 70 and the first conductive lines CLa. In other words, the memory cell array 70 and the first conductive lines CLa are disposed between the first contact plug group CT1a and CT2a and the second contact plug group CT1b and CT2b.

The first contact plug group CT1a and CT2a may include the first contact plugs CT1a and the second contact plugs CT2a that are disposed at a first side of the memory cell array 70, the second contact plugs CT2a having smaller resistance than the first contact plugs CT1a. The second contact plug group CT1b and CT2b may include the first contact plugs CT1b and the second contact plugs CT2b that are disposed at a second side of the memory cell array 70, the second contact plugs CT2b having smaller resistance than the first contact plugs CT1b. The first side and the second side of the memory cell array 70 are opposite to each other with respect to the memory cell array 70 in the second direction D2.

The first contact plugs CT1a at the first side and the first contact plugs CT1b at the second side may be coupled to the straight conductive lines CL1 to CL8, and may extend in the third direction D3. For example, the straight conductive lines CL1 to CL8 may be divided into first straight conductive lines CL1, CL3, CL5, and CL7 and second straight conductive lines CL2, CL4, CL6, and CL8. The first straight conductive lines CL1, CL3, CL5, and CL7 and the second straight conductive lines CL2, CL4, CL6, and CL8 are alternately disposed in the first direction D1. The first contact plugs CT1a at the first side may be coupled to the first straight conductive lines CL1, CL3, CL5, and CL7, respectively, and may be spaced apart from each other in the first direction D1. The first contact plugs CT1b at the second side may be coupled to the second straight conductive lines CL2, CL4, CL6, and CL8, respectively, and may be spaced apart from each other in the first direction D1.

The second contact plugs CT2a at the first side may be coupled to the first contact line portions P2 of the first bending conductive lines CL9 to CL14, respectively, and may extend in the third direction D3. A width of each of the second contact plugs CT2a in the second direction D2 may be greater than a width of each of the first contact plugs CT1a and CT1b in the first direction D1.

The second contact plugs CT2b at the second side may be coupled to the second contact line portions P4 of the second bending conductive lines CL15 to CL20, respectively, and may extend in the third direction D3. A width of each of the second contact plugs CT2b in the second direction D2 may be greater than a width of each of the first contact plugs CT1a and CT1b in the first direction D1.

As described above, the width of each of the second contact plugs CT2a and CT2b in the second direction D2 is greater than the width of each of the first contact plugs CT1a and CT1b in the first direction D1, such that resistance of each of the second contact plugs CT2a and CT2b may be smaller than resistance of each of the first contact plugs CT1a and CT1b. According to an embodiment of the present disclosure, even when the first distance L1, the second distance L2, and the fourth distance L4 are reduced to increase integration density of the memory cell array 70, the third distance L3 between the first contact line portions P2 and the fifth distance L5 between the second contact line portions P4 may be secured to be relatively great. Therefore, even when the width of each of the second contact plugs CT2a and CT2b in the second direction D2 is great, a space in which each of the second contact plugs CT2a and CT2b is disposed may be easily secured.

Figure 3:
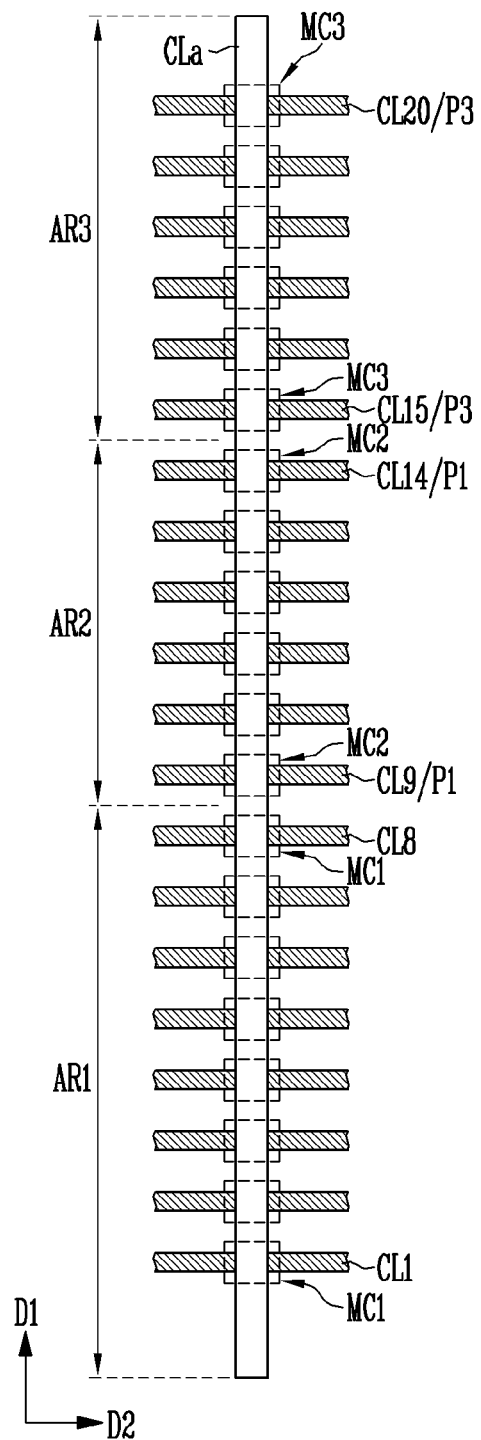
FIG. 3 illustrates memory cells coupled to one of the first conductive lines shown in FIG. 2.

FIG. 3 illustrates memory cells coupled to one of the first conductive lines CLa shown in FIG. 2.

Referring to FIG. 3, each of the first conductive lines CLa may be divided into a first portion AR1, a second portion AR2, and a third portion AR3 in the first direction D1. The first portion AR1 may be closer to the selection circuit 80 shown in FIG. 2 than the second and third portions AR2 and AR3. The second portion AR2 is disposed between the first portion AR1 and the third portion AR3.

First variable resistance memory cells MC1 may be disposed at intersections of the first portion AR1 of the first conductive line CLa and the straight conductive lines CL1 to CL8. The first variable resistance memory cells MC1 coupled to the first conductive line CLa may be arranged to be spaced apart from each other in the first direction D1 in which the straight conductive lines CL1 to CL8 are arranged to be spaced apart from each other. The first variable resistance memory cells MC1 may be disposed between the first conductive line CLa and the straight conductive lines CL1 to CL8.

Second variable resistance memory cells MC2 may be disposed at intersections of the second portion AR2 of the first conductive line CLa and the first bending conductive lines CL9 to CL14. The second variable resistance memory cells MC2 coupled to the first conductive line CLa may be arranged to be spaced apart from each other in the first direction D1 in which the first cell line portions P1 of the first bending conductive lines CL9 to CL14 are arranged to be spaced apart from each other. The second variable resistance memory cells MC2 may be disposed between the first conductive lines CLa and the first cell line portions P1.

Third variable resistance memory cells MC3 may be disposed at intersections of the third portion AR3 of the first conductive line CLa and the second bending conductive lines CL15 to CL20. The third variable resistance memory cells MC3 coupled to the first conductive line CLa may be arranged to be spaced apart from each other in the first direction D1 in which the second cell line portions P3 of the second bending conductive lines CL15 to CL20 are arranged to be spaced apart from each other. The third variable resistance memory cells MC3 may be disposed between the first conductive lines CLa and the second cell line portions P3.

Each of the first, second, and third variable resistance memory cells MC1, MC2, and MC3 may have the same configuration as the variable resistance memory cell MC described above with reference to FIG. 1.

Figure 4A:
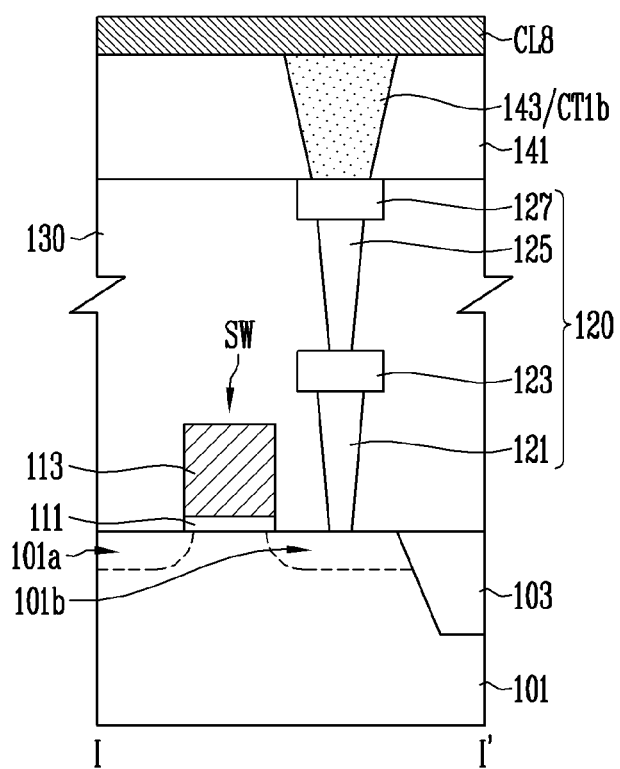
FIGS. 4A and 4B are cross-sectional views taken along lines I-I' and II-II' shown in FIG. 2, respectively.
Figure 4B:
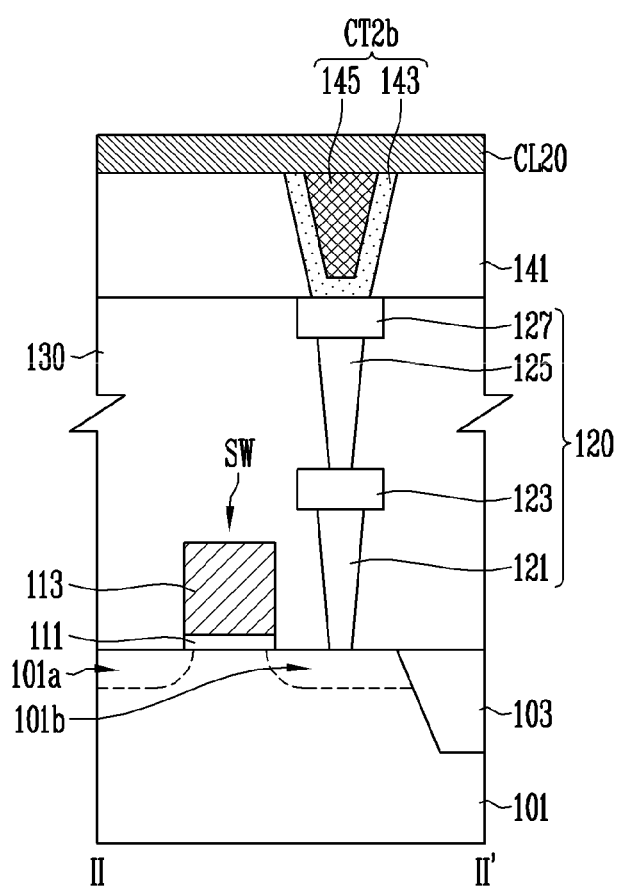

FIGS. 4A and 4B are cross-sectional views taken along lines I-I' and II-II' shown in FIG. 2, respectively.

Each of the second conductive lines CL1 to CL20 shown in FIG. 2 may be selected by the control of a switching device SW shown in FIG. 4A or 4B.

Referring to FIGS. 4A and 4B, the switching device SW may include a transistor. For example, the switching device SW may include a gate insulating layer 111 disposed on an active region of a substrate 101 defined by an isolation layer 103, a gate electrode 113 disposed on the gate insulating layer 111, and source/drain (S/D) regions 101a and 101b defined in the active region at two opposite sides of the gate electrode 113. One of the S/D regions 101a and 101b may be used as a drain of the transistor, and the other of the S/D regions 101a and 101b may be used as a source of the transistor.

The switching device SW may be covered by a lower insulating structure 130 formed over the substrate 101. The lower insulating structure 130 may include multiple insulating layers. Each of the second conductive lines CL1 to CL20 shown in FIG. 2 may be coupled to one of S/D regions of a switching device corresponding thereto, for example, the S/D region 101b shown in FIG. 4A or FIG. 4B. The second conductive lines CL1 to CL20 shown in FIG. 2 may be coupled to the S/D regions via the contact plugs CT1a, CT1b, CT2a, and CT2b.

Each of the second conductive lines CL1 to CL20 shown in FIG. 2 may be disposed on an insulating layer 141, and the insulating layer 141 may be disposed on the lower insulating structure 130. Each of the contact plugs CT1a, CT1b, CT2a, and CT2b shown in FIG. 2 may pass through the lower insulating structure 130 and the insulating layer 141. Each of the contact plugs CT1a, CT1b, CT2a, and CT2b shown in FIG. 2 may be coupled to a lower contact structure 120 shown in FIG. 4A or 4B.

Referring to FIGS. 4A and 4B, each of the lower contact structures 120 may be embedded in the lower insulating structure 130. Each of the lower contact structures 120 may have a stacked structure of multiple conductive layers 121, 123, 125, and 127. The lower contact structures 120 are not limited to embodiments illustrated in FIGS. 4A and 4B. According to other embodiments, the structure of the lower contact structure 120 may be variously changed. For example, each of the lower contact structures 120 may include a single conductive layer.

As illustrated in FIGS. 4A and 4B, each of the first contact plugs CT1a and CT1b at the first and second sides in FIG. 2 may include the same conductive material as one of conductive materials forming each of the second contact plugs CT2a and CT2b at the first and second sides in FIG. 2.

For example, each of the second contact plugs CT2a and CT2b may include a first conductive material 143 and a second conductive material 145 as illustrated in FIG. 4B. The first conductive material 143 has resistivity that is different from that of the second conductive material 145. The first conductive material 143 included in each of the second contact plugs CT2a and CT2b may surround the second conductive material 145. According to an embodiment, each of the first contact plugs CT1a and CT1b may include the first conductive material 143 as illustrated in FIG. 4A. According to another embodiment, each of the first contact plugs CT1a and CT1b may include the second conductive material 145. Resistivity of the second conductive material 145 may be greater or smaller than resistivity of the first conductive material 143.

According to an embodiment of the present disclosure, even when the same bias voltage is applied to the switching devices SW coupled to the second conductive lines CL1 to CL20, voltage levels of signals applied to the second conductive lines CL1 to CL20 via the contact plugs CT1a, CT1b, CT2a, and CT2b may be differently controlled by resistance of the contact plugs CT1a, CT1b, CT2a, and CT2b. Therefore, according to the embodiment of the present disclosure, a delay in signal depending on locations of memory cells in each of the first conductive lines CLa may be compensated by the resistance of the contact plugs CT1a, CT1b, CT2a, and CT2b.

For example, referring to the first memory cell MC1 and the second memory cell MC2 of the memory cell array 70 shown in FIG. 2, the second memory cell MC2 may be disposed farther from the selection circuit 80 than the first memory cell MC1. Accordingly, the second memory cell MC2 may be affected by a delay in signal of the first conductive line CLa. According to an embodiment of the present disclosure, because the second conductive line CL9 coupled to the second memory cell MC2 is coupled to the second contact plug CT2a having lower resistance than the first contact plugs CT1a and CT1b, a delay in signal of the first conductive line CLa may be compensated.

Figure 5:
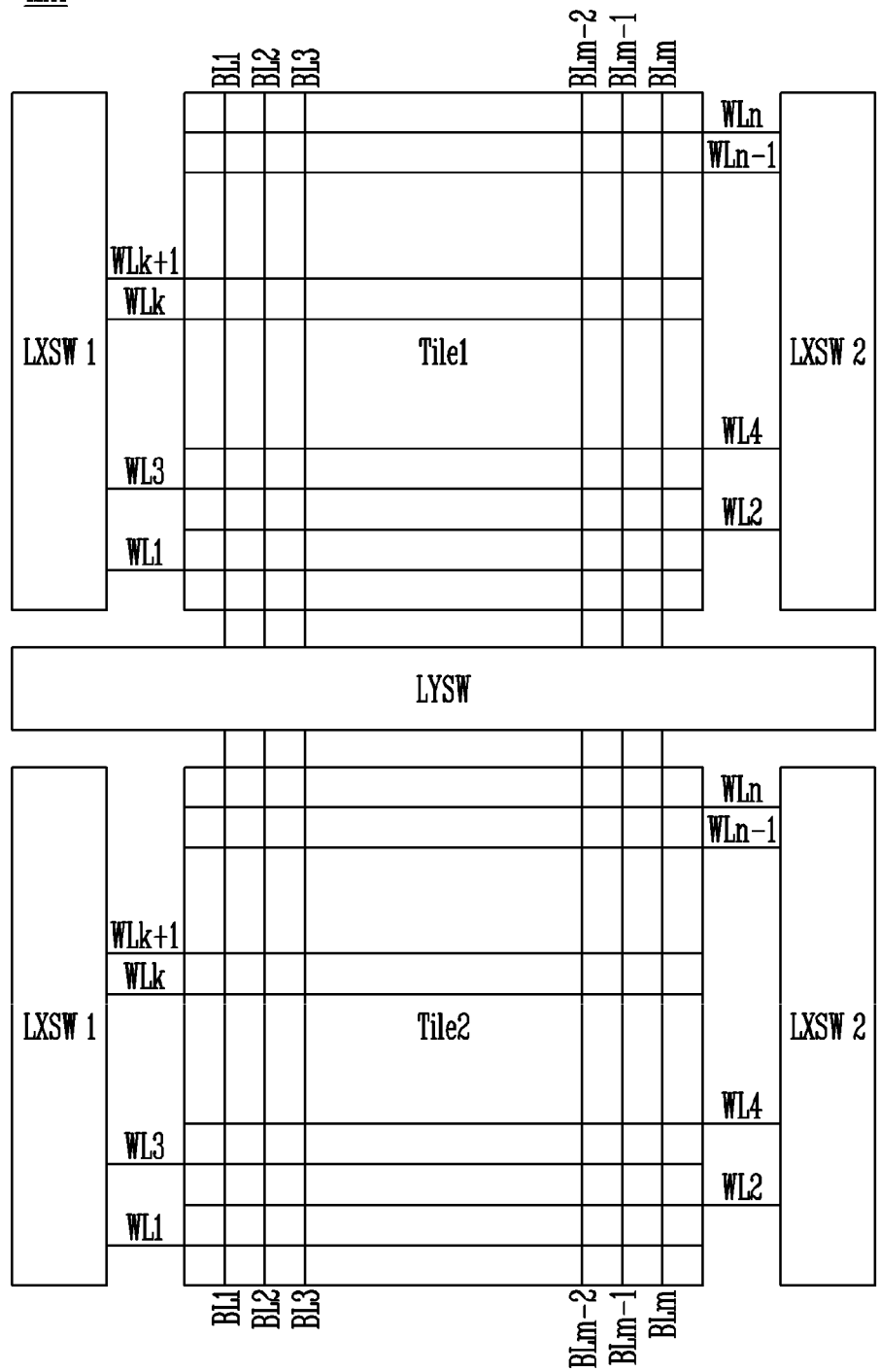
FIGS. 5 and 6 illustrate a configuration of a memory device according to an embodiment of the present disclosure.
Figure 6:
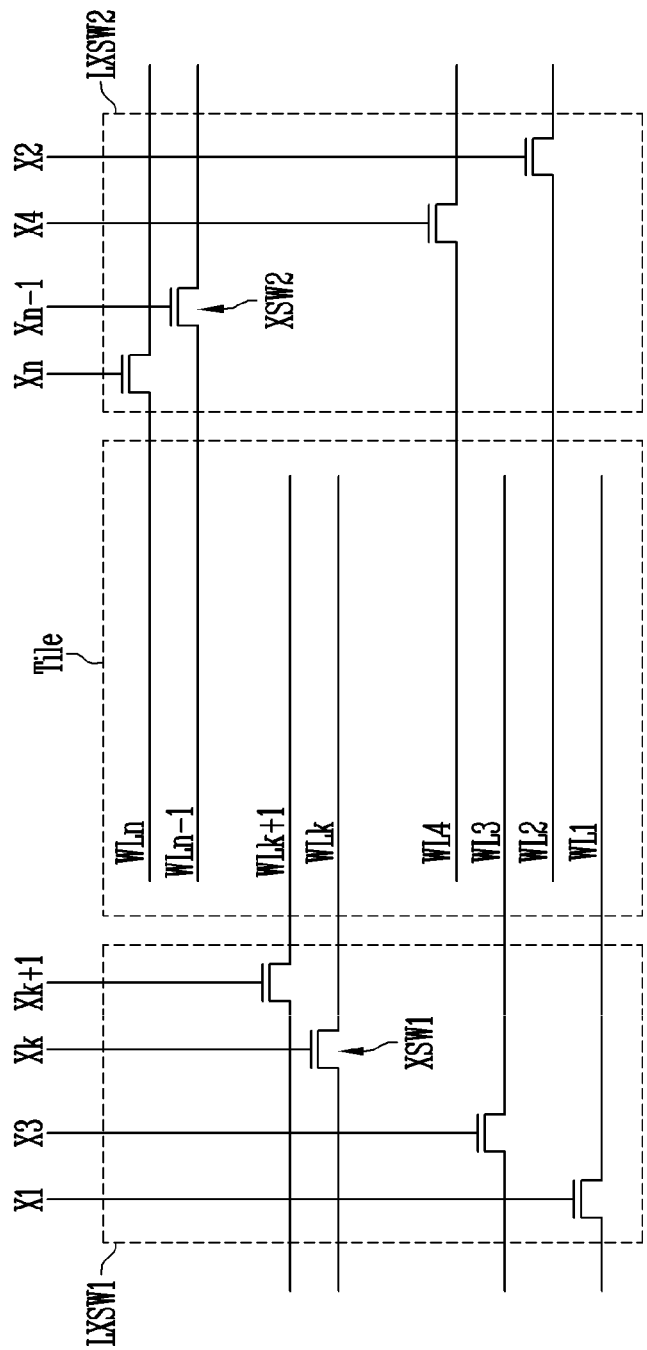

FIGS. 5 and 6 illustrate a configuration of a memory device according to an embodiment of the present disclosure. The memory device may include a memory cell array including a plurality of mats.

FIG. 5 illustrates a configuration of a single mat of the memory device.

Referring to FIG. 5, the mat may include a first tile Tile1 and a second tile Tile2 that share a column selection circuit LYSW.

The column selection circuit LYSW may be disposed between the first tile Tile1 and the second tile Tile2.

Each of the first tile Tile1 and the second tile Tile2 may include variable resistance memory cells coupled to a plurality of bit lines BL1 to BLm, m being a positive integer. The column selection circuit LYSW may include switching devices for selecting the bit lines BL1 to BLm. The plurality of bit lines BL1 to BLm may be coupled to the column selection circuit LYSW, and may extend through a corresponding tile.

In each of the first tile Tile1 and the second tile Tile2, the plurality of bit lines BL1 to BLm may cross a plurality of word lines WL1 to WLn, n being a positive integer. A first row selection circuit LXSW1 and a second row selection circuit LXSW2 may be disposed at opposite sides of each of the first tile Tile1 and the second tile Tile2, and may be coupled to the plurality of word lines WL1 to WLn. In other words, each of the first tile Tile1 and the second tile Tile2 may be disposed between the first row selection circuit LXSW1 and the second row selection circuit LXSW2.

The plurality of bit lines BL1 to BLm of the mat MAT having the configuration described above may have the same layout as the first conductive lines CLa shown in FIG. 2. The plurality of word lines WL1 to WLn may have the same layout as the second conductive lines CL1 to CL20 shown in FIG. 2.

FIG. 6 illustrates the first row selection circuit LXSW1 and the second row selection circuit LXSW2 shown in FIG. 5 according to an embodiment of the present disclosure. A tile Tile shown in FIG. 6 may be the first tile Tile1 or the second tile Tile2 shown in FIG. 5.

Referring to FIG. 6, the plurality of word lines WL1 to WLn may include first word lines WL1, WL3, . . . , WLk, and WLk+1 selected by the first row selection circuit LXSW1 and second word lines WL2, WL4, . . . , WLn−1, and WLn selected by the second row selection circuit LXSW2.

The first row selection circuit LXSW1 may include first switching devices XSW1 selecting the first word lines WL1, WL3, . . . , WLk, and WLk+1 in response to first word line selection signals X1, X3, ..., Xk, and Xk+1, respectively. The second row selection circuit LXSW2 may include second switching devices XSW2 selecting the second word lines WL2, WL4, ..., WLn-1, and WLn in response to second word line selection signals X2, X4, ..., Xn-1, and Xn, respectively.

For example, the first word lines WL1, WL3, ..., WLk, and WLk+1 may include first straight word lines WL1 and WL3 and first bending word lines WLk and WLk+1. The second word lines WL2, WL4, ..., WLn-1 and WLn may include second straight word lines WL2 and WL4 and second bending word lines WLn-1 and WLn. The first straight word lines WL1 and WL3 and the second straight word lines WL2 and WL4 may be alternately arranged with each other. The first bending word lines WLk and WLk+1 may be spaced apart from the column selection circuit LYSW shown in FIG. 5 by the first straight word lines WL1 and WL3 and the second straight word lines WL2 and WL4 that are interposed between the first bending word lines WLk and WLk+1 and the column selection circuit LYSW. The second bending word lines WLn-1 and WLn may be spaced apart from the column selection circuit LYSW by the first straight word lines WL1 and WL3, the second straight word lines WL2 and WL4, and the first bending word lines WLk and WLk+1 that are interposed between the second bending word lines WLn-1 and WLn and the column selection circuit LYSW.

The first straight word lines WL1 and WL3 may have the same structure and layout as the first straight conductive lines CL1, CL3, CL5, and CL7 described above with reference to FIG. 2. The first bending word lines WLk and WLk+1 may have the same structure and layout as the first bending conductive lines CL9 to CL14 described above with reference to FIG. 2.

The first straight word lines WL1 and WL3 may be coupled to the corresponding first switching devices XSW1 via contact plugs that have the same structure and the same material as the first contact plugs CT1a described above with reference to FIGS. 2 and 4A. The first bending word lines WLk and WLk+1 may be coupled to the corresponding first switching devices XSW1 via contact plugs that have the same structure and the same material as the second contact plugs CT2a described above with reference to FIGS. 2 and 4B.

The second straight word lines WL2 and WL4 may have the same structure and layout as the second straight conductive lines CL2, CL4, CL6, and CL8 described above with reference to FIG. 2. The second bending word lines WLn-1 and WLn may have the same structure and layout as the second bending conductive lines CL15 to CL20 described above with reference to FIG. 2.

The second straight word lines WL2 and WL4 may be coupled to the corresponding second switching devices XSW2 via contact plugs that have the same structure and the same material as the first contact plugs CT1b described above with reference to FIGS. 2 and 4A. The second bending word lines WLn-1 and WLn may be coupled to the corresponding second switching devices XSW2 via contact plugs that have the same structure and the same material as the second contact plugs CT2b described above with reference to FIGS. 2 and 4B.

Figure 7:
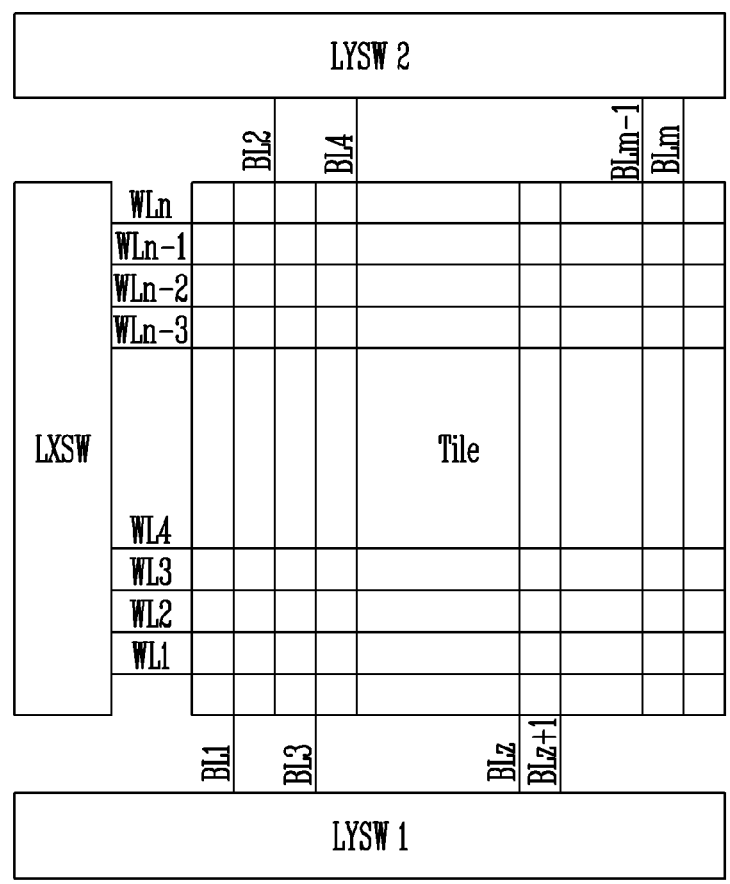
FIGS. 7 and 8 illustrate a configuration of a memory device according to an embodiment of the present disclosure.
Figure 8:
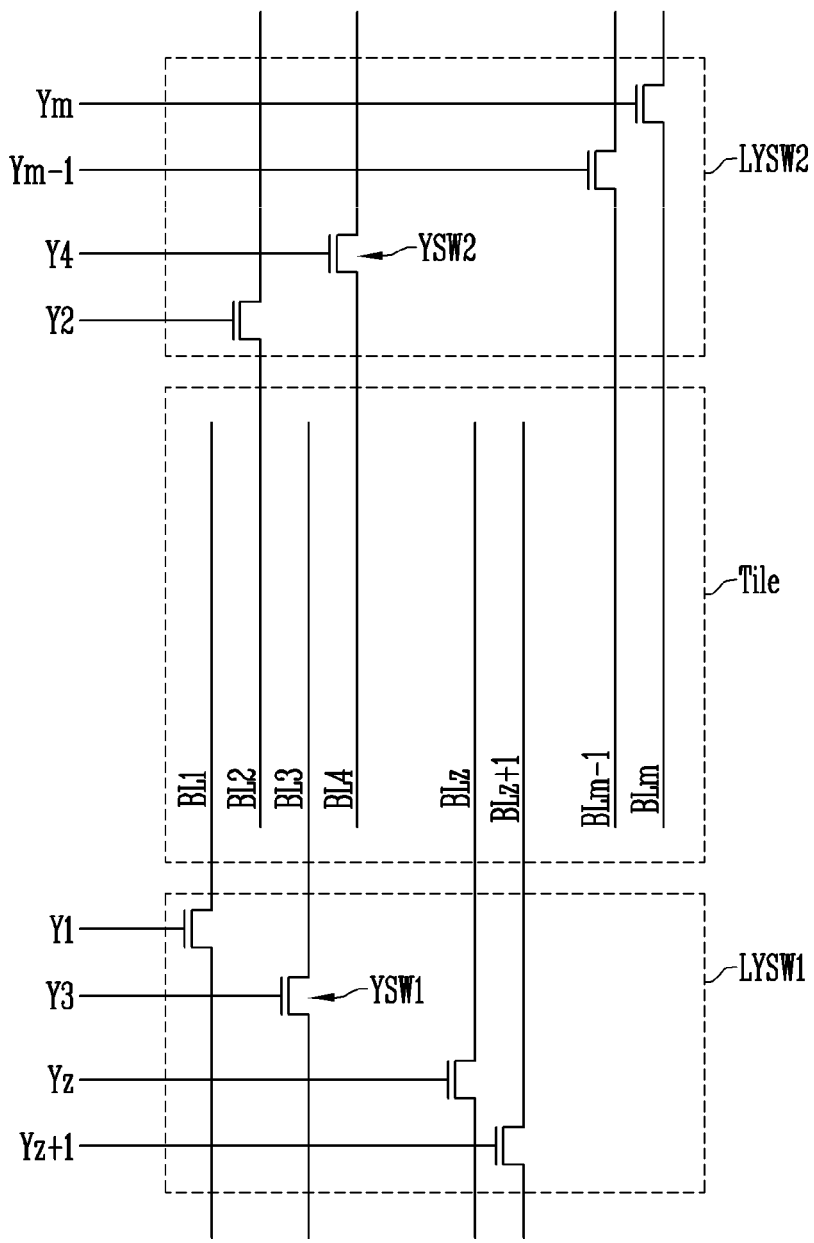

FIGS. 7 and 8 illustrate a configuration of a memory device according to an embodiment of the present disclosure. A memory cell array of the memory device may include a plurality of tiles.

FIG. 7 illustrates a configuration of a single tile Tile of the memory device.

Referring to FIG. 7, the tile Tile may be disposed between a first column selection circuit LYSW1 and a second column selection circuit LYSW2.

The tile Tile may include variable resistance memory cells coupled to a plurality of word lines WL1 to WLn. The plurality of word lines WL1 to WLn may be coupled to a row selection circuit LXSW disposed between the first column selection circuit LYSW1 and the second column selection circuit LYSW2. The row selection circuit LXSW may include switching devices selecting the word lines WL1 to WLn. The plurality of word lines WL1 to WLn may be coupled to the row selection circuit LXSW, and may extend through the tile Tile.

The plurality of word lines WL1 to WLn may cross a plurality of bit lines BL1 to BLm. The first column selection circuit LYSW1 and the second column selection circuit LYSW2 may be disposed at opposite sides of the tile Tile and coupled to the plurality of bit lines BL1 to BLm.

The plurality of word lines WL1 to WLn of the tile Tile having a configuration described above may have the same layout as the first conductive lines CLa shown in FIG. 2. The plurality of bit lines BL1 to BLm may have the same structure and layout as the second conductive lines CL1 to CL20 shown in FIG. 2.

FIG. 8 illustrates the first column selection circuit LYSW1 and the second column selection circuit LYSW2 shown in FIG. 7 according to an embodiment of the present disclosure.

Referring to FIG. 8, the plurality of bit lines BL1 to BLm may include first bit lines BL1, BL3, ..., BLz, and BLz+1 selected by the first column selection circuit LYSW1 and second bit lines BL2, BL4, ..., BLm-1, and BLm selected by the second column selection circuit LYSW2.

The first column selection circuit LYSW1 may include first switching devices YSW1 selecting the first bit lines BL1, BL3, ..., BLz, and BLz+1 in response to first bit line selection signals Y1, Y3, ..., Yz, and Yz+1, respectively. The second column selection circuit LYSW2 may include second switching devices YSW2 selecting the second bit lines BL2, BL4, ..., BLm-1, and BLm in response to second bit line selection signals Y2, Y4, ..., Ym-1, and Ym, respectively.

For example, the first bit lines BL1, BL3, ..., BLz, and BLz+1 may include first straight bit lines BL1 and BL3 and first bending bit lines BLz and BLz+1. The second bit lines BL2, BL4, ..., BLm-1, and BLm may include second straight bit lines BL2 and BL4 and second bending bit lines BLm-1 and BLm. The first straight bit lines BL1 and BL3 and the second straight bit lines BL2 and BL4 may be alternately arranged with each other. The first bending bit lines BLz and BLz+1 may be spaced apart from the row selection circuit LXSW shown in FIG. 7 by the first straight bit lines BL1 and BL3 and the second straight bit lines BL2 and BL4 that are interposed between the first bending bit lines BLz and BLz+1 and the row selection circuit LXSW. The second bending bit lines BLm-1 and BLm may be spaced apart from the row selection circuit LXSW by the first straight bit lines BL1 and BL3, the second straight bit lines BL2 and BL4, and the first bending bit lines BLz and BLz+1 that are interposed between the second bending bit lines BLm-1 and BLm and the row selection circuit LXSW.

The first straight bit lines BL1 and BL3 may have the same structure and layout as the first straight conductive lines CL1, CL3, CL5, and CL7 described above with reference to FIG. 2. The first bending bit lines BLz and BLz+1 may have the same structure and layout as the first bending conductive lines CL9 to CL14 described above with reference to FIG. 2.

The first straight bit lines BL1 and BL3 may be coupled to the corresponding first switching devices YSW1 via contact plugs that have the same structure and the same material as the first contact plugs CT1a described above with reference to FIGS. 2 and 4A. The first bending bit lines BLz and BLz+1 may be coupled to the corresponding first switching devices YSW1 via contact plugs that have the same structure and the same material as the second contact plugs CT2a described above with reference to FIGS. 2 and 4B.

The second straight bit lines BL2 and BL4 may have the same structure and layout as the second straight conductive lines CL2, CL4, CL6, and CL8 described above with reference to FIG. 2. The second bending bit lines BLm−1 and BLm may have the same structure and layout as the second bending conductive lines CL15 to CL20 described above with reference to FIG. 2.

The second straight bit lines BL2 and BL4 may be coupled to the corresponding second switching devices YSW2 via contact plugs that have the same structure and the same material as the first contact plugs CT1b described above with reference to FIGS. 2 and 4A. The second bending bit lines BLm−1 and BLm may be coupled to the corresponding second switching devices YSW2 via contact plugs that have the same structure and the same material as the second contact plugs CT2b described above with reference to FIGS. 2 and 4B.

FIGS. 9A to 16C illustrate a method of manufacturing a memory device according to an embodiment of the present disclosure. The manufacturing method may provide the second conductive lines CL1 to CL20 and the contact plugs CT1a, CT1b, CT2a, and CT2b described above with reference to FIGS. 2, 3, 4A, and 4B.

Figure 9B:
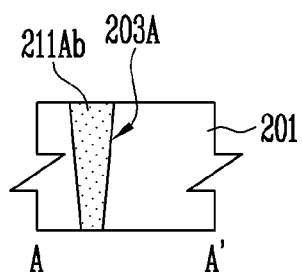
Figure 9C:
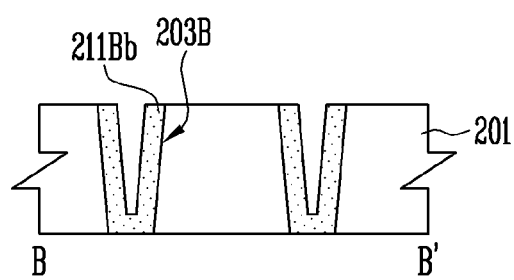

FIGS. 9A, 9B, and 9C illustrate a process of forming first contact plugs 211Aa and 211Ab. FIG. 9A illustrates a layout of the first contact plugs 211Aa and 211Ab. FIG. 9B illustrates a cross-sectional view taken along line A-A' shown in FIG. 9A. FIG. 9C illustrates a cross-sectional view taken along line B-B' shown in FIG. 9A.

Referring to FIGS. 9A, 9B, and 9C, holes 203A and 203B passing through an insulating layer 201 may be formed. The insulating layer 201 may include a first contact region CTA1, a second contact region CTA2, and a memory cell array region MCR. The memory cell array region MCR is disposed between the first contact region CTA1 and the second contact region CTA2. The insulating layer 201 may be formed over the lower insulating structure 130 covering the switching devices SW as described above with reference to FIGS. 4A and 4B. That is, the insulating layer 201 may correspond to the insulating layer 141 shown in FIGS. 4A and 4B.

The holes 203A and 203B may include first holes 203A and second holes 203B. Each of the first holes 203A may have a first width W1 in a first direction, and each of the second holes 203B may have a second width W2 in a second direction crossing the first direction, the second width W2 being greater than the first width W1.

The first holes 203A may be divided into a first group disposed in the first contact region CTA1 and a second group disposed in the second contact region CTA2. Similarly, the second holes 203B may be divided into a first group disposed in the first contact region CTA1 and a second group disposed in the second contact region CTA2.

Subsequently, a first conductive material may be formed to fill the first holes 203A and the second holes 203B, and then the first conductive material may be planarized to expose a top surface of the insulating layer 201. Accordingly, the first contact plug 211Aa or 211Ab including the first conductive material may be formed in each of the first holes 203A.

Each of the first holes 203A may be completely filled with the first conductive material since the first holes 203A are relatively narrow. On the other hand, each of the second holes 203B may not be completely filled with the first conductive material since the second holes 203B are relatively wide. In other words, the first conductive material may be formed along a surface of each of the second holes 203B. Accordingly, a conductive liner pattern 211Ba or 211Bb including the first conductive material may be formed in each of the second holes 203B after the planarization of the first conductive material.

As described above, because the first contact plugs 211Aa and 211Ab and the conductive liner patterns 211Ba and 211Bb are formed at the same time by adjusting the first width W1 of each of the first holes 203A and the second width W2 of each of the second holes 203B to be different from each other, a manufacturing process may be simplified according to an embodiment of the present disclosure.

The first contact plugs 211Aa and 211Ab may include the first contact plugs 211Aa formed in the first contact region CTA1 and the first contact plugs 211Ab formed in the second contact region CTA2. The conductive liner patterns 211Ba and 211Bb may include first conductive liner patterns 211Ba formed in the first contact region CTA1 and second conductive liner patterns 211Bb formed in the second contact region CTA2.

Figure 10A:
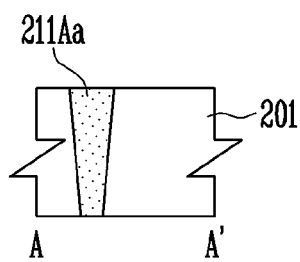
Figure 10B:
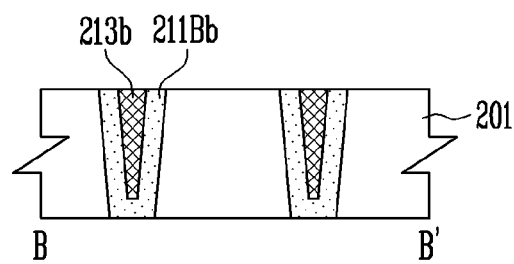

FIGS. 10A and 10B illustrate a process of forming second contact plugs 215A and 215B. As to a layout of the second contact plugs 215A and 215B, FIG. 11A may be referred.

Figure 11A:
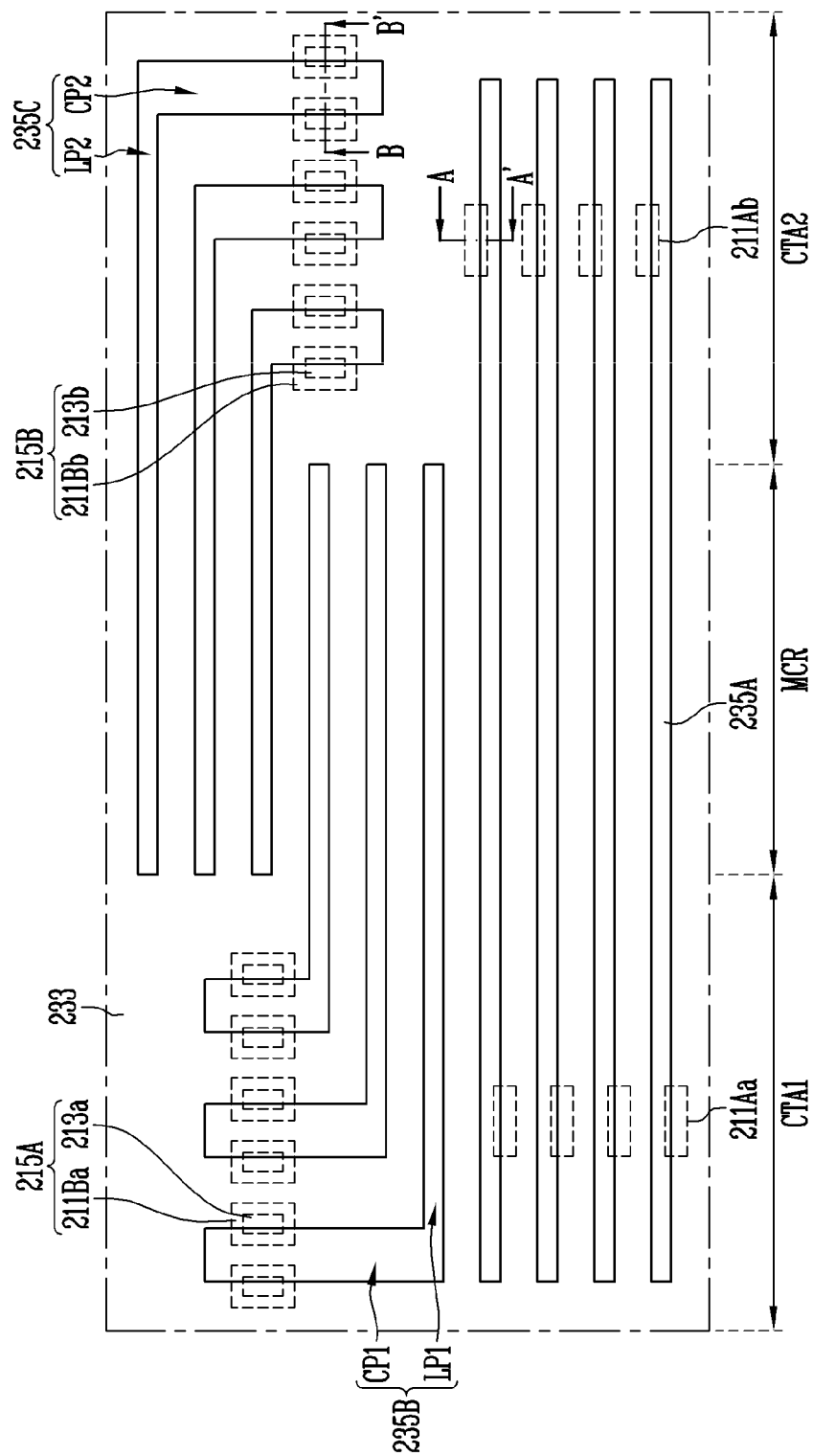

A second conductive material may be formed to fill a central region of each of the second holes 203B opened by the first conductive liner pattern 211Ba or the second conductive liner pattern 211Bb as shown in FIG. 9A. Subsequently, the second conductive material may be planarized to expose the top surface of the insulating layer 201 as shown in FIGS. 10A and 10B. Accordingly, as illustrated in FIG. 11A, a conductive core pattern 213a or 213b including the second conductive material may be formed in each of the second holes 203B shown in FIG. 9A. The conductive core patterns 213a and 213b may include first conductive core patterns 213a formed in the second holes 203B disposed in the first contact region CTA1 and second conductive core patterns 213b formed in the second holes 203B disposed in the second contact region CTA2, as illustrated in FIG. 11A. The second conductive material may have lower resistivity than the first conductive material.

According to an embodiment of the present disclosure, even though an etching process to secure a space in which the conductive core pattern 213a or 213b is disposed is not separately performed, the central region of each of the second holes 203B may be opened by adjusting a deposition thickness of the first conductive material. Accordingly, the manufacturing process may be simplified according to the embodiment of the present disclosure.

Figure 11B:
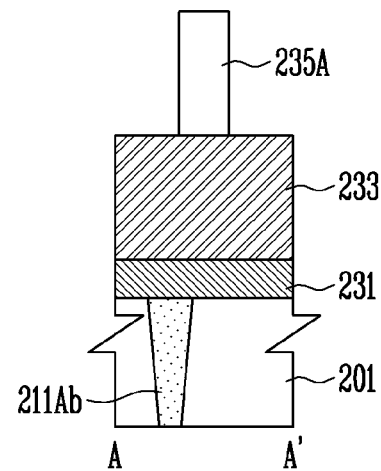
Figure 11C:
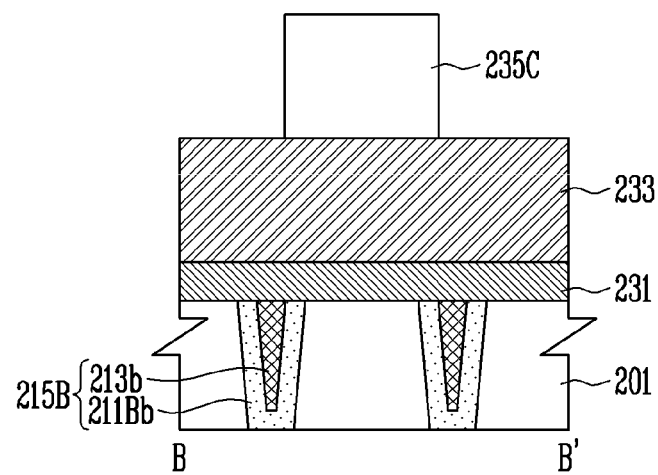

FIGS. 11A, 11B, and 11C illustrate a process of forming sacrificial patterns 235A, 235B, and 235C. FIG. 11A illustrates a layout of the sacrificial patterns 235A, 235B, and 235C. FIG. 11B illustrates a cross-sectional view taken along line A-A' shown in FIG. 11A. FIG. 11C illustrates a cross-sectional view taken along line B-B' shown in FIG. 11A.

The first conductive liner patterns 211Ba and the first conductive core patterns 213*a* may form the second contact plugs 215A in the first contact region CTA1, and the second conductive liner patterns 211Bb and the second conductive core patterns 213*b* may form the second contact plugs 215B in the second contact region CTA2. Each of the second contact plugs 215A may include a pair of the first conductive liner pattern 211Ba and the first conductive core pattern 213*a*. Each of the second contact plugs 215B may include a pair of the second conductive liner pattern 211Bb and the second conductive core pattern 213*b*.

A conductive layer 231 may be formed on the insulating layer 201 after the first contact plugs 211Aa and 211Ab and the second contact plugs 215A and 215B are formed. The conductive layer 231 may extend to cover the first contact plugs 211Aa and 211Ab and the second contact plugs 215A and 215B.

Subsequently, a mask layer 233 may be formed on the conductive layer 231. The mask layer 233 may include a material having a different etch rate from the conductive layer 231.

Subsequently, the sacrificial patterns 235A, 235B, and 235C may be formed on the mask layer 233. The sacrificial patterns 235A, 235B, and 235C may include a material having a different etch rate from the mask layer 233. The sacrificial patterns 235A, 235B, and 235C may include first sacrificial patterns 235A, second sacrificial patterns 235B, and third sacrificial patterns 235C.

Each of the first sacrificial patterns 235A may overlap the memory cell array region MCR, and may extend to have a linear shape in the first contact region CTA1 and the second contact region CTA2. Each of the first sacrificial patterns 235A may overlap a pair of the first contact plug 211Aa formed in the first contact region CTA1 and the first contact plug 211Ab formed in the second contact region CTA2. Each of the first contact plugs 211Aa and 211Ab may be partially covered by a corresponding one of the first sacrificial patterns 235A.

The second sacrificial patterns 235B may include first line portions LP1 and first contact portions CP1, the first line portions LP1 being parallel with the first sacrificial patterns 235A in the first contact region CTA1 and the memory cell array region MCR, the first contact portions CP1 protruding from the first line portions LP1, respectively. The first contact portions CP1 may extend over the second contact plugs 215A from the first line portions LP1, respectively, in the first contact region CTA1. Each of the second sacrificial patterns 235B may include a pair of the first line portion LP1 and the first contact portion CP1. Each of the first contact portions CP1 may overlap two second contact plugs 215A among the second contact plugs 215A formed in the first contact region CTA1. Each of the second contact plugs 215A may include a portion that does not overlap the first contact portion CP1. That is, each of the second contact plugs 215A may be partially covered by a corresponding one of the first contact portions CP1.

The third sacrificial patterns 235C may include second line portions LP2 and second contact portions CP2, the second line portions LP2 being parallel with the first sacrificial patterns 235A in the memory cell array region MCR and the second contact region CTA2, the second contact portions CP2 protruding from the second line portions LP2, respectively. The second line portions LP2 may be spaced apart from the first sacrificial patterns 235A by the first line portions LP1. The second contact portions CP2 may extend from the second line portions LP2, respectively, toward the first sacrificial patterns 235A in the second contact region CTA2. Each of the third sacrificial patterns 235C may include a pair of the second line portion LP2 and the second contact portion CP2. Each of the second contact portions CP2 may overlap two second contact plugs 215B among the second contact plugs 215B formed in the second contact region CTA2. Each of the second contact plugs 215B may include a portion that does not overlap the second contact portion CP2. That is, each of the second contact plugs 215B may be partially covered by a corresponding one of the second contact portions CP2.

Figure 12A:
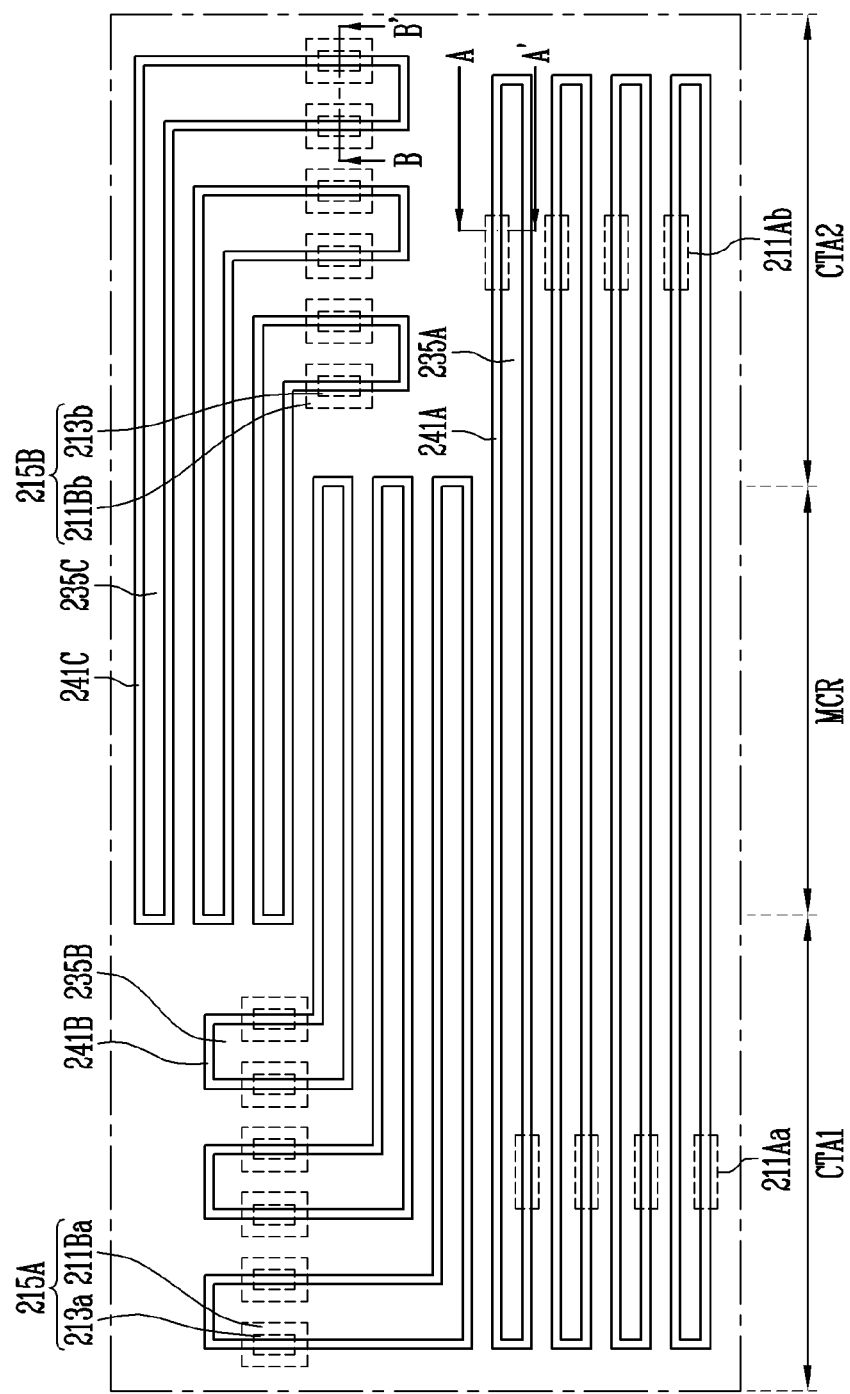
Figure 12B:
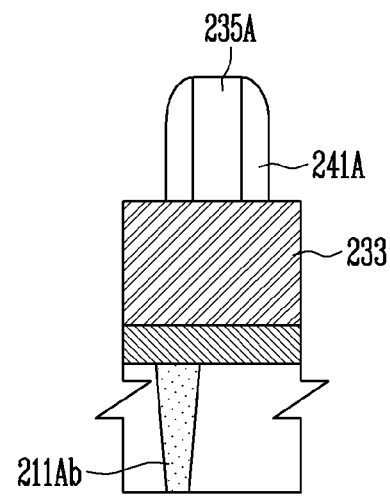
Figure 12C:
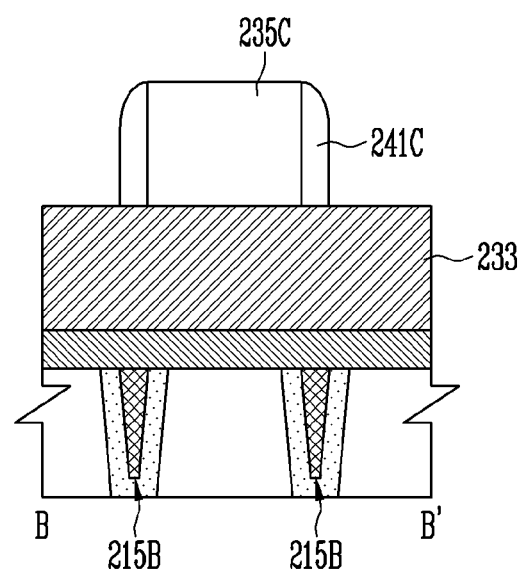

FIGS. 12A, 12B, and 12C illustrate a process of forming spacer layers 241A, 241B, and 241C. FIG. 12A illustrates a layout of the spacer layers 241A, 241B, and 241C. FIG. 12B illustrates a cross-sectional view taken along line A-A' shown in FIG. 12A. FIG. 12C illustrates a cross-sectional view taken along line B-B' shown in FIG. 12A.

Referring to FIGS. 12A, 12B, and 12C, the spacer layers 241A, 241B, and 241C may be formed on sidewalls of the sacrificial patterns 235A, 235B, and 235C. The spacer layers 241A, 241B, and 241C may include a material having a different etch rate from the sacrificial patterns 235A, 235B, and 235C and the mask layer 233. The spacer layers 241A, 241B, and 241C may include first spacer layers 241A, second spacer layers 241B, and third spacer layers 241C.

The first spacer layers 241A may be spaced apart from each other. Each of the first spacer layers 241A may surround the first sacrificial pattern 235A corresponding thereto. Each of the first spacer layers 241A may be formed over and overlap a pair of the first contact plug 211Aa and the first contact plug 211Ab that correspond thereto and are disposed in the first contact region CTA1 and the second contact region CTA2, respectively.

The second spacer layers 241B may be spaced apart from each other. Each of the second spacer layers 241B may surround the second sacrificial pattern 235B corresponding thereto. Each of the second spacer layers 241B may be formed over and overlap two second contact plugs 215A that correspond thereto among the second contact plugs 215A disposed in the first contact region CTA1.

The third spacer layers 241C may be spaced apart from each other. Each of the third spacer layers 241C may surround the third sacrificial pattern 235C corresponding thereto. Each of the third spacer layers 241C may be formed over and overlap two second contact plugs 215B that correspond thereto among the second contact plugs 215B disposed in the second contact region CTA2.

Figure 13:
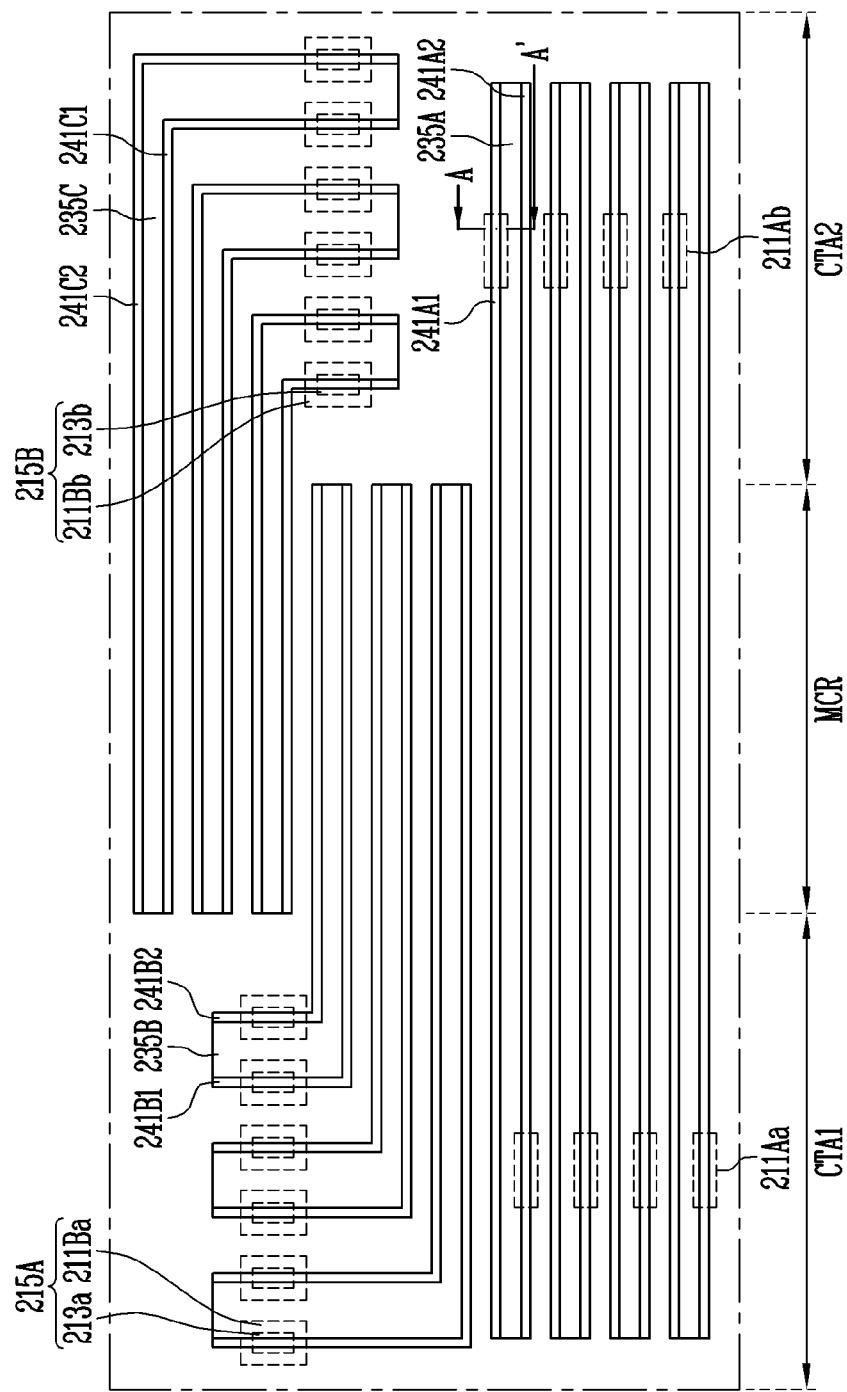

FIG. 13 illustrates a process of forming spacer patterns 241A1, 241A2, 241B1, 241B2, 241C1, and 241C2. FIG. 13 illustrates a layout of the spacer patterns 241A1, 241A2, 241B1, 241B2, 241C1, and 241C2.

Referring to FIG. 13, each of the first spacer layers 241A shown in FIG. 12A may be divided into the first spacer patterns 241A1 and 241A2, each of the second spacer layers 241B shown in FIG. 12A may be divided into the second spacer patterns 241B1 and 241B2, and each of the third spacer layers 241C shown in FIG. 12A may be divided into the third spacer patterns 241C1 and 241C2. To divide each of the spacer layers into the spacer patterns, each of the first, second, and third spacer layers 241A, 241B, and 241C may be partially etched to expose sidewalls of two ends of a corresponding one of the first, second, and third sacrificial patterns 235A, 235B, and 235C in a longitudinal direction.

Each of the first spacer patterns 241A1 and 241A2 may overlap a corresponding one of the first contact plugs 211Aa in the first contact region CTA1 and the first contact plugs 211Ab in the second contact region CTA2.

Each of the second spacer patterns 241B1 and 241B2 may overlap a corresponding one of the second contact plugs 215A in the first contact region CTA1.

Each of the third spacer patterns 241C1 and 241C2 may overlap a corresponding one of the second contact plugs 215B in the second contact region CTA2.

Figure 14A:
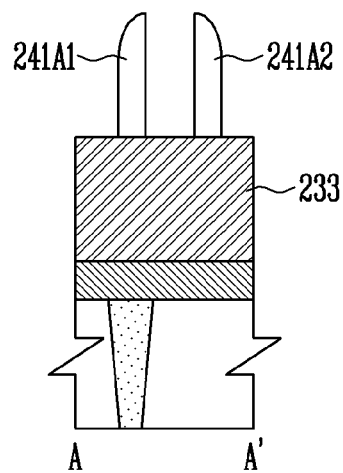
Figure 14B:
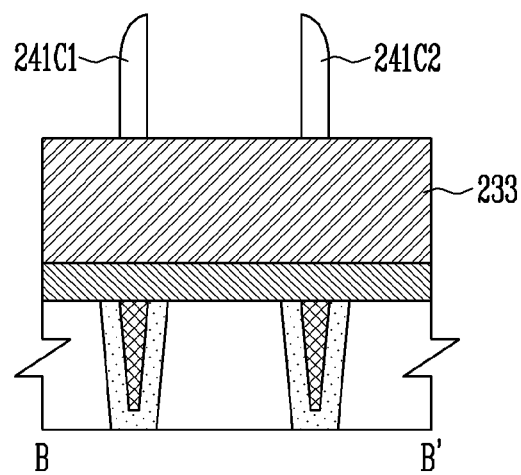

FIGS. 14A and 14B are cross-sectional views illustrating a process of removing the first, second, and third sacrificial patterns 235A, 235B, and 235C shown in FIG. 13.

Referring to FIGS. 14A and 14B, because the first, second, and third sacrificial patterns 235A, 235B, and 235C shown in FIG. 13 are removed, the mask layer 233 may be exposed between the first spacer patterns 241A1 and 241A2 that are adjacent to each other and between the third spacer patterns 241C1 and 241C2 that are adjacent to each other. Similarly, the mask layer 233 may be exposed between the second spacer patterns 241B1 and 241B2 that are adjacent to each other as shown in FIG. 13.

Figure 15A:
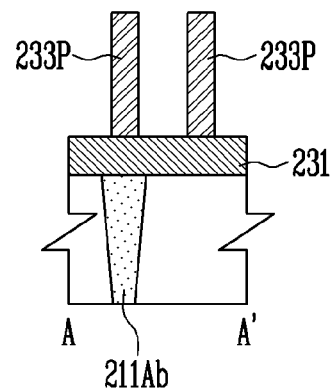
Figure 15B:
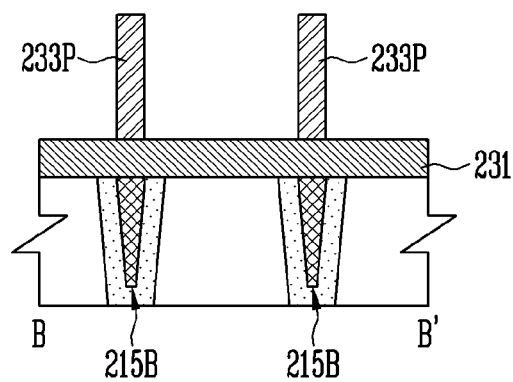

FIGS. 15A and 15B are cross-sectional views illustrating a process of forming mask patterns 233P.

Referring to FIGS. 15A and 15B, the mask layer 233 shown in FIGS. 14A and 14B may be etched by performing an etching process using, as an etching barrier, the first spacer patterns 241A1 and 241A2, the second spacer patterns 241B1 and 241B2, and the third spacer patterns 241C1 and 241C2 having the layout shown in FIGS. 13, 14A, and 14B. Accordingly, the mask patterns 233P may be formed to have the same layout as the first spacer patterns 241A1 and 241A2, the second spacer patterns 241B1 and 241B2, and the third spacer patterns 241C1 and 241C2 shown in FIG. 13.

The mask patterns 233P may respectively overlap the first contact plugs 211Aa in the first contact region CTA1, the first contact plugs 211Ab in the second contact region CTA2, the second contact plugs 215A in the first contact region CTA1, and the second contact plugs 215B in the second contact region CTA2.

Figure 16A:
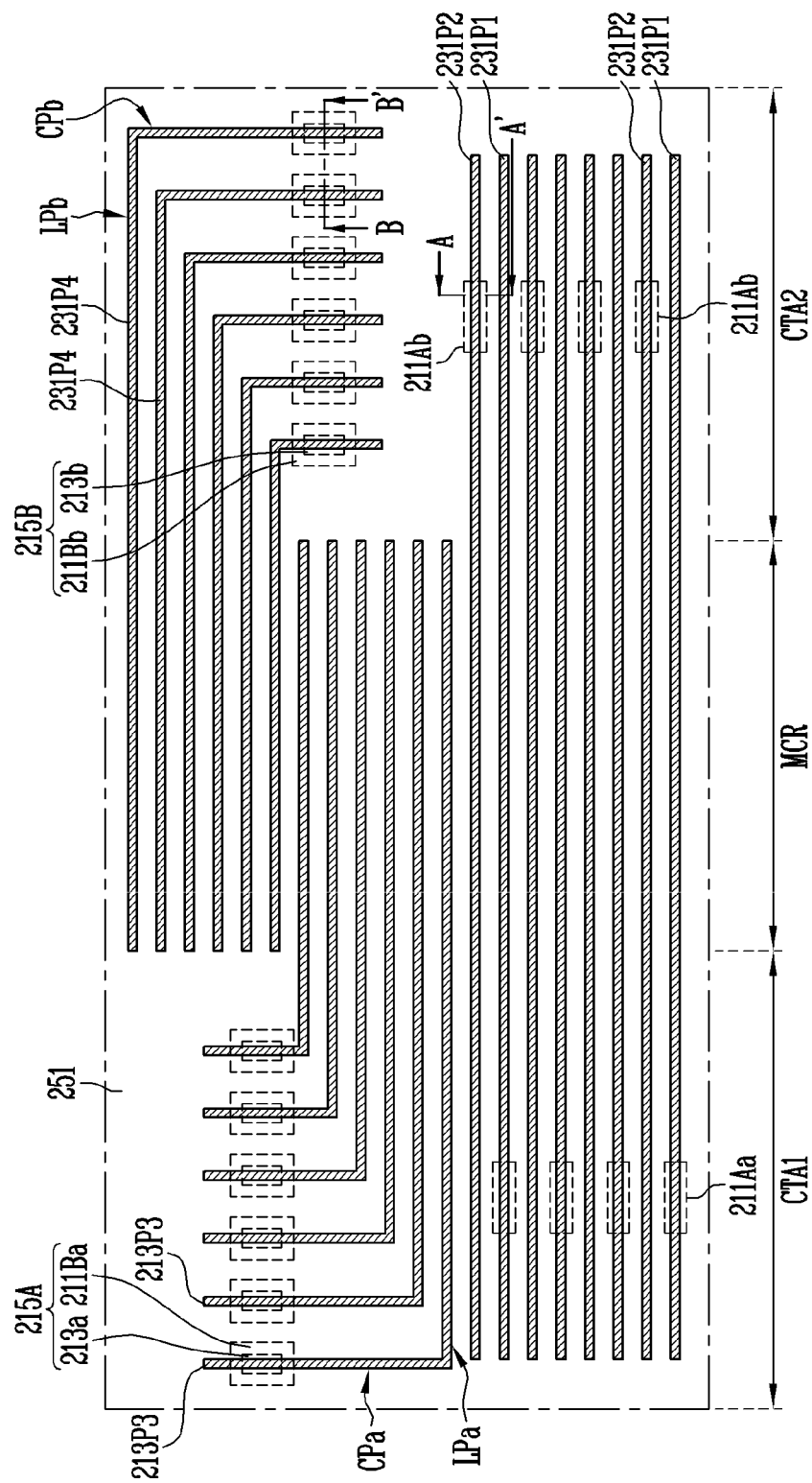
Figure 16B:
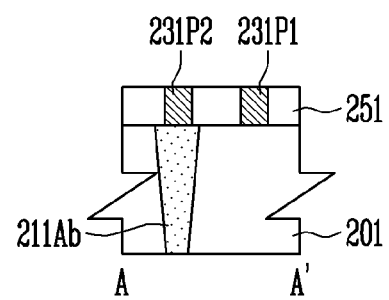
Figure 16C:
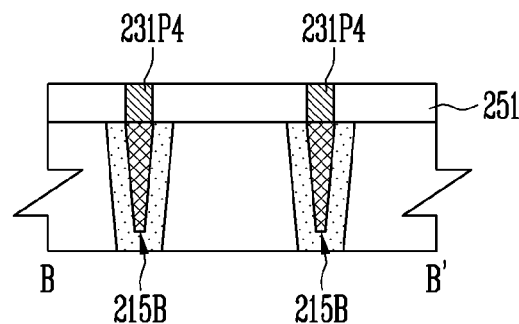

FIGS. 16A, 16B, and 16C illustrate a process of forming conductive lines 231P1, 231P2, 231P3, and 231P4. FIG. 16A illustrates a layout of the conductive lines 231P1, 231P2, 231P3, and 231P4. FIG. 16B illustrates a cross-sectional view taken along line A-A' shown in FIG. 16A. FIG. 16C illustrates a cross-sectional view taken along line B-B' shown in FIG. 16A.

Referring to FIGS. 16A, 16B, and 16C, the conductive layer 231 shown in FIGS. 15A and 15B may be etched by performing an etching process using the mask patterns 233P as an etching barrier. Accordingly, the conductive lines 231P1, 231P2, 231P3, and 231P4 having the same layout as the first spacer patterns 241A1 and 241A2, the second spacer patterns 241B1 and 241B2, and the third spacer patterns 241C1 and 241C2 shown in FIG. 13 may be formed. Subsequently, spaces between the conductive lines 231P1, 231P2, 231P3, and 231P4 may be filled with an insulating material 251.

The conductive lines 231P1, 231P2, 231P3, and 231P4 may include first straight conductive lines 231P1, second straight conductive lines 231P2, first bending conductive lines 231P3, and second bending conductive lines 231P4.

The first straight conductive lines 231P1 may be coupled to the first contact plugs 211Aa in the first contact region CTA1, respectively. The second straight conductive lines 231P2 may be coupled to the first contact plugs 211Ab in the second contact region CTA2, respectively. The first straight conductive lines 231P1 and the second straight conductive lines 231P2 may be alternately disposed with each other.

The first bending conductive lines 231P3 may be coupled to the second contact plugs 215A in the first contact region CTA1, respectively. Each of the first bending conductive lines 231P3 may include a first cell line portion LPa, which is parallel with the first and second straight conductive lines 231P1 and 231P2, and a first contact line portion CPa extending from the first cell line portion LPa to overlap a corresponding one of the second contact plugs 215A in the first contact region CTA1.

The second bending conductive lines 231P4 may be coupled to the second contact plugs 215B in the second contact regions CTA2, respectively. Each of the second bending conductive lines 231P4 may include a second cell line portion LPb, which is parallel with the first and second straight conductive lines 231P1 and 231P2, and a second contact line portion CPb extending from the second cell line portion LPb to cover a corresponding one of the second contact plugs 215B in the second contact region CTA2.

Figure 17:
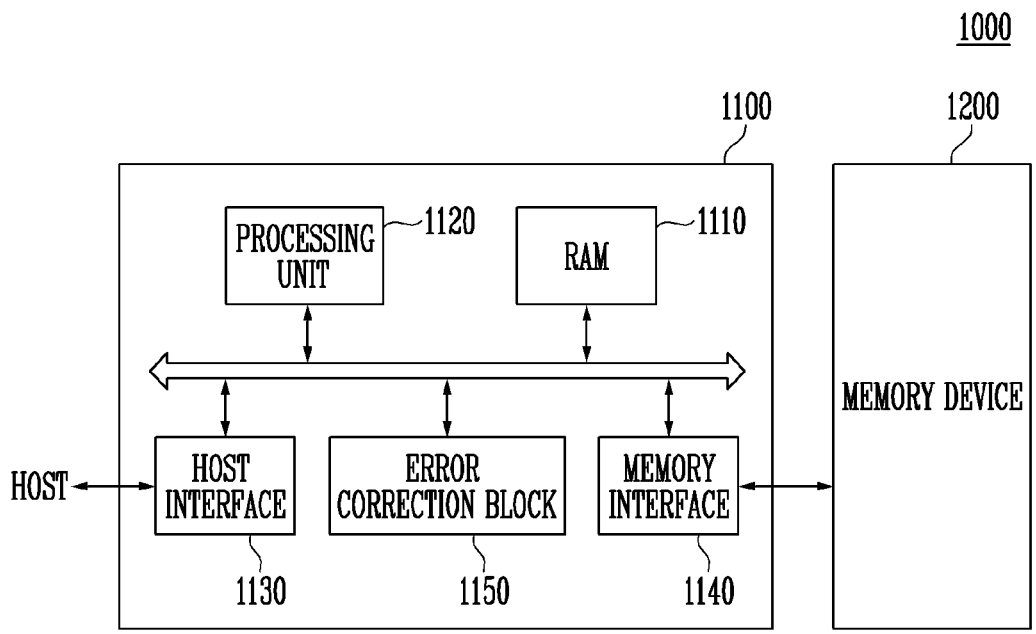
FIG. 17 illustrates a memory system according to an embodiment of the present disclosure.

FIG. 17 illustrates a memory system 1000 according to an embodiment of the present disclosure.

Referring to FIG. 17, the memory system 1000 may include a memory device 1200 and a controller 1100.

The controller 1100 may be coupled to a host and the memory device 1200. The controller 1100 may be configured to access the memory device 1200 in response to a request of the host. For example, the controller 1100 may control a read operation, a write operation, and a background operation of the memory device 1200. The controller 1100 may be configured to control the read operation by storing polarity of a read pulse determined according to the characteristics of a memory cell.

The controller 1100 may be configured to provide an interface between the memory device 1200 and the host. The controller 1100 may be configured to run firmware for controlling the memory device 1200.

The controller 1100 may include a Random Access Memory (RAM) 1110, a processing unit 1120, a host interface 1130, a memory interface 1140, and an error correction block 1150.

The RAM 1110 may serve as an operation memory of the processing unit 1120, a cache memory between the memory device 1200 and the host, and a buffer memory between the memory device 1200 and the host. The processing unit 1120 may control general operations of the controller 1100. In addition, the controller 1100 may temporarily store program data provided from the host during a program operation.

The host interface 1130 may include a protocol for data exchange between the host and the controller 1100. The protocol may be one of protocols such as a Peripheral Component Interconnect (PCI) protocol, a Peripheral Component Interconnect-Express (PCI-E) protocol, an Advanced Technology Attachment (ATA) protocol, a Serial ATA (SATA) protocol, a Parallel ATA (PATA) protocol, a Small computer small interface (SCSI) protocol, a Serial attached SCSI (SAS) protocol, a Universal Serial Bus (USB) protocol, a Multi-Media Card (MMC) protocol, an Enhanced Small Disk Interface (ESDI) protocol, and an Integrated Drive Electronics (IDE) protocol.

The memory interface 1140 may interface with the memory device 1200.

The error correction block 1150 may be configured to use an Error Correcting Code (ECC) to detect and correct an error in data received from the memory device 1200. The processing unit 1120 may control the memory device 1200.

According to an embodiment, the error correction block 1150 may be provided as one of the components of the controller 1100.

The controller 1100 and the memory device 1200 may be integrated into a single semiconductor device. In an embodiment, the controller 1100 and the memory device 1200 may be integrated into a single semiconductor device to form a memory card such as a personal computer memory card international association (PCMCIA), a compact flash card (CF), a smart media card (SM or SMC), a memory stick, a multimedia card (MMC, RS-MMC, or MMCmicro), an SD card (SD, miniSD, microSD, or SDHC), a universal flash storage (UFS), or the like.

The controller 1100 and the memory device 1200 may be integrated into a single semiconductor device to form a Solid State Drive (SSD). The SSD may include a storage device configured to store data in a memory device. When the memory system 1000 is used as an SSD, an operational rate of the host coupled to the memory system 1000 may be significantly improved.

In another example, the memory system 1000 may be provided as one of various components of an electronic device. The electronic device may be one of a computer, an Ultra Mobile PC (UMPC), a workstation, a net-book, Personal Digital Assistants (PDAs), a portable computer, a web tablet, a wireless phone, a mobile phone, a smartphone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various electronic devices for forming a home network, one of various electronic devices for forming a computer network, one of various electronic devices for forming a telematics network, an RFID device, one of various elements for forming a computing system, and so on.

In an embodiment, the memory device 1200 or the memory system 1000 may be embedded in packages in various forms. For example, the memory device 1200 or the memory system 1000 may be embedded in packages such as a Package on Package (PoP), Ball grid arrays (BGAs), Chip scale packages (CSPs), a Plastic Leaded Chip Carrier (PLCC), a Plastic Dual In Line Package (PDIP), a Die in Waffle Pack, a Die in Wafer Form, a Chip On Board (COB), a Ceramic Dual In Line Package (CERDIP), a Plastic Metric Quad Flat Pack (MQFP), a Thin Quad Flatpack (TQFP), a Small Outline Integrated Circuit (SOIC), a Shrink Small Outline Package (SSOP), a Thin Small Outline Package (TSOP), a System In Package (SIP), a Multi Chip Package (MCP), a Wafer-level Fabricated Package (WFP), or a Wafer-Level Processed Stack Package (WSP).

Figure 18:
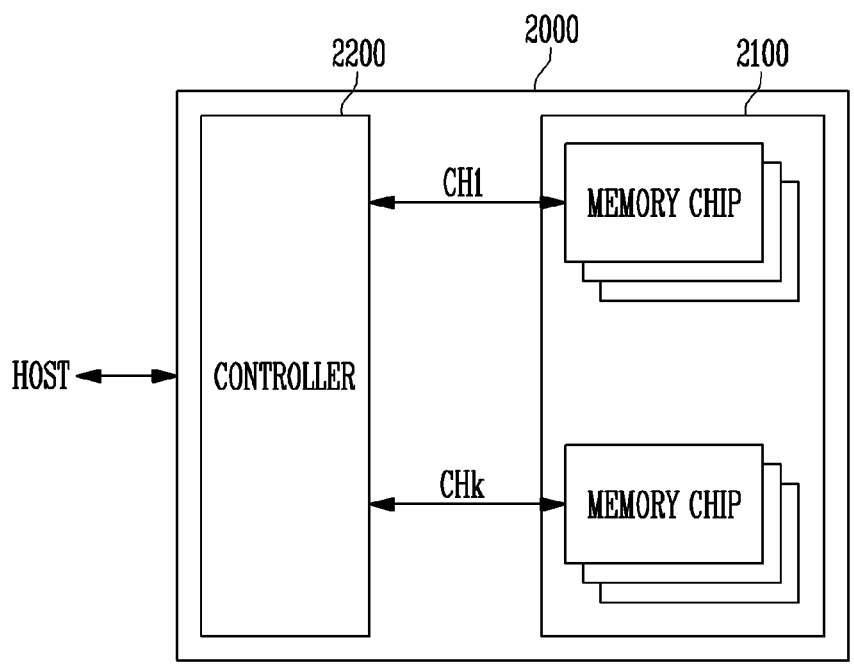
FIG. 18 illustrates a memory system according to another embodiment of the present disclosure.

FIG. 18 illustrates a memory system 2000 according to another embodiment of the present disclosure.

Referring to FIG. 18, the memory system 2000 may include a memory device 2100 and a controller 2200. The memory device 2100 may include a plurality of semiconductor memory chips. The plurality of semiconductor memory chips may be divided into a plurality of groups.

The plurality of groups may communicate with the controller 2200 through first to kth channels CH1 to CHk. Each of the semiconductor memory chips may be configured and operate as the memory device 1200 described above with reference to FIG. 17.

Each group may be configured to communicate with the controller 2200 through a single common channel among the first to kth channels CH1 to CHk. The controller 2200 may be configured in substantially the same manner as the controller 1100 described above with reference to FIG. 17, and configured to control the plurality of semiconductor memory chips of the memory device 2100 through the plurality of first to kth channels CH1 to CHk.

Figure 19:
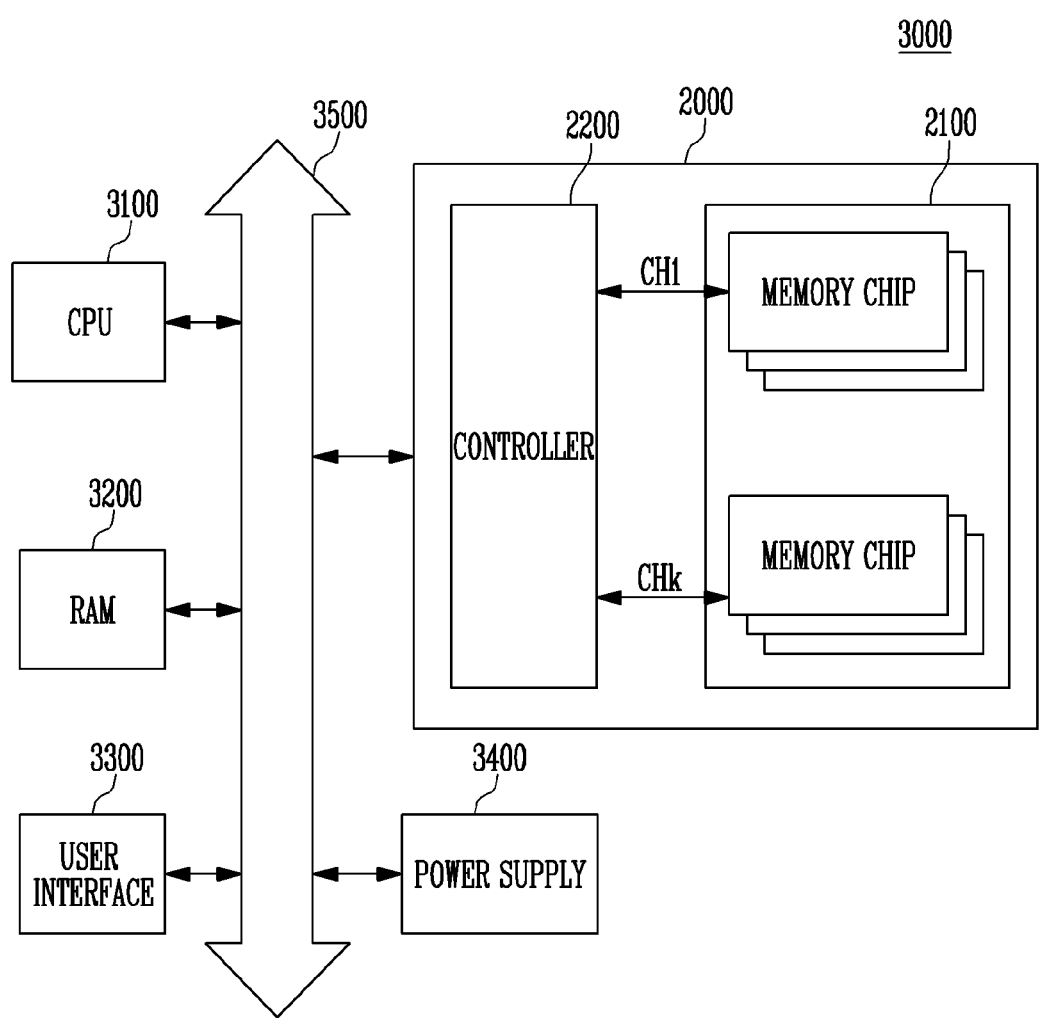
FIG. 19 illustrates a computing system according to an embodiment of the present disclosure.

FIG. 19 illustrates a computing system 3000 according to an embodiment of the present disclosure.

The computing system 3000 may include a central processing unit (CPU) 3100, a Random Access Memory (RAM) 3200, a user interface 3300, a power supply 3400, a system bus 3500, and a memory system 2000.

The memory system 2000 may be electrically coupled to the central processing unit 3100, the RAM 3200, the user interface 3300, and the power supply 3400 through the system bus 3500. Data provided through the user interface 3300 or data processed by the central processing unit 3100 may be stored in the memory system 2000.

The memory system 2000 may correspond to the memory system 2000 described above with reference to FIG. 18. Therefore, the memory system 2000 may include a controller 2200 and a memory device 2100. The memory device 2100 may be coupled to the system bus 3500 through the controller 2200. Alternatively, the memory device 2100 may be directly coupled to the system bus 3500. The functions of the controller 2200 may be performed by the central processing unit 3100 and the RAM 3200.

FIG. 19 illustrates the computing system 3000 having the memory system 2000 described above with reference to FIG. 18. However, embodiments of the present disclosure are not limited thereto. For example, the memory system 2000 of the computing system 3000 may be replaced with the memory system 1000 described above with reference to FIG. 17. In an embodiment, the computing system 3000 may include both of the memory systems 1000 and 2000 described above with reference to FIGS. 17 and 18, respectively.

According to the embodiments of the present disclosure, contact plugs coupled to conductive lines may be formed to have different resistance according to positions of the conductive lines. Accordingly, a structure to compensate for a delay in signal according to positions of memory cells may be stably provided. Thus, the operational reliability of a memory device may be improved.

According to the embodiments of the present disclosure, holes where contact plugs are formed may be formed to have different widths. Accordingly, resistance of the contact plugs may be easily controlled with a simplified process.

What is claimed is:

1. A memory device, comprising:
    a memory cell array having variable resistance memory cells that are coupled to and disposed between first conductive lines each extending in a first direction and second conductive lines crossing the first conductive lines; and
    a selection circuit configured to select the first conductive lines,
    wherein the second conductive lines comprise:
    straight conductive lines each extending in a second direction, the second direction crossing the first direction; and
    first bending conductive lines spaced apart from the selection circuit by the straight conductive lines, the first bending conductive lines extending parallel with each other and having an L shape, wherein each of the first bending conductive lines has a portion extending in the first direction, wherein inflection points of the first bending conductive lines are spaced apart at different distances from each of the first conductive lines.

2. The memory device of claim 1, further comprising:
first contact plugs coupled to the straight conductive lines and extending in a third direction, the third direction being perpendicular to the first direction and the second direction; and
second contact plugs coupled to the first bending conductive lines and extending in the third direction, the second contact plugs having resistance smaller than resistance of the first contact plugs.

3. The memory device of claim 2, wherein a width of each of the second contact plugs in the second direction is greater than a width of each of the first contact plugs in the first direction.

4. The memory device of claim 2, wherein each of the second contact plugs includes a first conductive material and a second conductive material, the first and second conductive materials having different resistivity.

5. The memory device of claim 4, wherein one of the first conductive material and the second conductive material is the same as a material included in each of the first contact plugs.

6. The memory device of claim 2,
wherein the straight conductive lines include first straight conductive lines and second straight conductive lines that are alternately arranged in the first direction,
wherein the first contact plugs are divided into a first group that is coupled to the first straight conductive lines and a second group that is coupled to the second straight conductive lines, and
wherein the memory cell array is disposed between the first group of the first contact plugs and the second group of the first contact plugs.

7. The memory device of claim 1,
wherein the second conductive lines further comprise second bending conductive lines crossing the first conductive lines,
wherein the first bending conductive lines are disposed between the second bending conductive lines and the straight conductive lines in the first direction,
wherein the second bending conductive lines include second cell line portions that are parallel with the straight conductive lines and second contact line portions that extend from the second cell line portions, respectively, toward the straight conductive lines,
wherein the second cell line portions are arranged to be spaced apart from each other in the first direction, and
wherein the second contact line portions are arranged to be spaced apart from each other in the second direction.

8. The memory device of claim 7, wherein a distance between two neighboring ones of the second contact line portions is greater than a distance between two neighboring ones of the second cell line portions and a distance between two neighboring ones of the straight conductive lines.

9. The memory device of claim 7, further comprising:
first contact plugs coupled to the straight conductive lines; and
second contact plugs coupled to the second contact line portions and having resistance smaller than resistance of the first contact plugs.

10. A memory device, comprising:
a memory cell array having variable resistance memory cells that are coupled to and disposed between first conductive lines each extending in a first direction and second conductive lines crossing the first conductive lines; and
a selection circuit configured to select the first conductive lines,
wherein the second conductive lines comprise:
straight conductive lines each extending in a second direction, the second direction crossing the first direction; and
first bending conductive lines spaced apart from the selection circuit by the straight conductive lines, the first bending conductive lines extending parallel with each other and having an L shape,
wherein the first bending conductive lines include first cell line portions and first contact line portions, the first contact line portions extending from the first cell line portions, respectively,
wherein the first cell line portions extend in the second direction and are arranged to be spaced apart from each other in the first direction, and
wherein the first contact line portions extend in the first direction and are arranged to be spaced apart from each other in the second direction.

11. The memory device of claim 10, wherein a distance between two neighboring ones of the first contact line portions is greater than a distance between two neighboring ones of the first cell line portions and a distance between two neighboring ones of the straight conductive lines.

12. The memory device of claim 10, further comprising:
first contact plugs coupled to the straight conductive lines; and
second contact plugs coupled to the first contact line portions and having resistance smaller than resistance of the first contact plugs.

13. A memory device, comprising:
a first conductive line including first, second, and third portions sequentially arranged in a first direction;
first variable resistance memory cells coupled to the first portion of the first conductive line and arranged in the first direction;
a second variable resistance memory cell coupled to the second portion of the first conductive line;
a third variable resistance memory cell coupled to the third portion of the first conductive line; and
second conductive lines coupled to the first, second, and third variable resistance memory cells and crossing the first conductive line,
wherein the second conductive lines comprise:
straight conductive lines coupled to the first variable resistance memory cells, respectively;
a first bending conductive line including a first cell line portion and a first contact line portion, the first cell line portion being coupled to the second variable resistance memory cell and crossing the first conductive line, the first contact line portion extending from the first cell line portion in the first direction; and
a second bending conductive line including a second cell line portion and a second contact line portion, the second cell line portion being coupled to the third variable resistance memory cell and crossing the first conductive line, the second contact line portion extending from the second cell line portion toward the straight conductive lines.

14. The memory device of claim 13, further comprising a selection circuit connected to an end of the first conductive line, wherein the first portion of the first conductive line is disposed closest to the selection circuit among the first, second, and third portions of the first conductive line.

15. The memory device of claim 13, further comprising:
first contact plugs coupled to the straight conductive lines, respectively; and
second contact plugs coupled to the first contact line portion and the second contact line portion, respectively, and having resistance smaller than resistance of the first contact plugs.

16. The memory device of claim 15, wherein a width of each of the second contact plugs in a second direction crossing the first direction is greater than a width of each of the first contact plugs in the first direction.

17. The memory device of claim 15, wherein each of the second contact plugs includes a first conductive material and a second conductive material, the first conductive material and the second conductive material having different resistivity.

18. The memory device of claim 17, wherein one of the first conductive material and the second conductive material is the same as a material included in each of the first contact plugs.

19. The memory device of claim 13,
wherein the second contact line portion extends from the second cell line portion toward the straight conductive lines, and
wherein the first contact line portion extends from the first cell line portion in a direction opposite to a direction in which the second contact line portion extends from the second cell line portion.

20. The memory device of claim 13, wherein the first contact line portion and the second contact line portion are spaced apart from each other by the first conductive line.

21. The memory device of claim 20, wherein the straight conductive lines include a first straight conductive line and a second straight conductive line that are alternately disposed with each other in the first direction.

22. The memory device of claim 21, further comprising:
a first group including a first contact plug coupled to the first straight conductive line and a second contact plug coupled to the first contact line portion; and
a second group including a third contact plug coupled to the second straight conductive line and a fourth contact plug coupled to the second contact line portion,
wherein the first group and the second group are spaced apart from each other by the first conductive line.

23. The memory device of claim 22, wherein each of the second contact plug and the fourth contact plug has resistance smaller than resistance of each of the first contact plug and the third contact plug.

* * * * *